(12) United States Patent
Iguchi et al.

(10) Patent No.: US 11,133,434 B2
(45) Date of Patent: Sep. 28, 2021

(54) IMAGE DISPLAY DEVICE

(71) Applicant: SHARP KABUSHIKI KAISHA, Sakai (JP)

(72) Inventors: Katsuji Iguchi, Sakai (JP); Koji Takahashi, Sakai (JP); Hidenori Kawanishi, Sakai (JP); Peter John Roberts, Oxford (GB); Nathan Cole, Oxford (GB)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/289,942

(22) Filed: Mar. 1, 2019

(65) Prior Publication Data

US 2019/0273179 A1  Sep. 5, 2019

(30) Foreign Application Priority Data

Mar. 2, 2018 (JP) .............................. JP2018-038038

(51) Int. Cl.

| H01L 33/10 | (2010.01) |
|---|---|
| H01L 25/075 | (2006.01) |
| H01L 33/62 | (2010.01) |
| H01L 33/32 | (2010.01) |
| H01L 33/00 | (2010.01) |
| H01L 33/50 | (2010.01) |

(52) U.S. Cl.
CPC .......... *H01L 33/10* (2013.01); *H01L 25/0753* (2013.01); *H01L 33/0075* (2013.01); *H01L 33/32* (2013.01); *H01L 33/505* (2013.01); *H01L 33/62* (2013.01); *H01L 2933/0041* (2013.01); *H01L 2933/0066* (2013.01)

(58) Field of Classification Search
CPC ... H01L 33/0075; H01L 33/32; H01L 33/505; H01L 33/62
See application file for complete search history.

(56) References Cited

U.S. PATENT DOCUMENTS

| 2012/0087107 A1 | 4/2012 | Kunimasa et al. | |
|---|---|---|---|
| 2015/0362165 A1* | 12/2015 | Chu | ........................ H01L 33/32 362/235 |
| 2017/0003548 A1* | 1/2017 | Mizunuma | ........ G02F 1/133617 |
| 2017/0092820 A1* | 3/2017 | Kim | ........................ H01L 33/32 |
| 2017/0201073 A1* | 7/2017 | Futagawa | ........... H01L 21/0262 |

FOREIGN PATENT DOCUMENTS

| JP | 2002-141492 A | 5/2002 |
|---|---|---|
| WO | 2010/143461 A1 | 12/2010 |
| WO | 2017/130607 A1 | 8/2017 |

* cited by examiner

*Primary Examiner* — Trang Q Tran
(74) *Attorney, Agent, or Firm* — ScienBiziP, P.C.

(57) ABSTRACT

An image display device includes a drive circuit substrate, micro LED elements, and a wavelength conversion layer that converts excitation light emitted from the micro LED elements and that emits converted long-wavelength light to a side opposite to the drive circuit substrate, the micro LED elements and the wavelength conversion layer being sequentially stacked on the drive circuit substrate. The micro LED elements include a first multilayer film that reflects the long-wavelength light converted by the wavelength conversion layer.

35 Claims, 23 Drawing Sheets

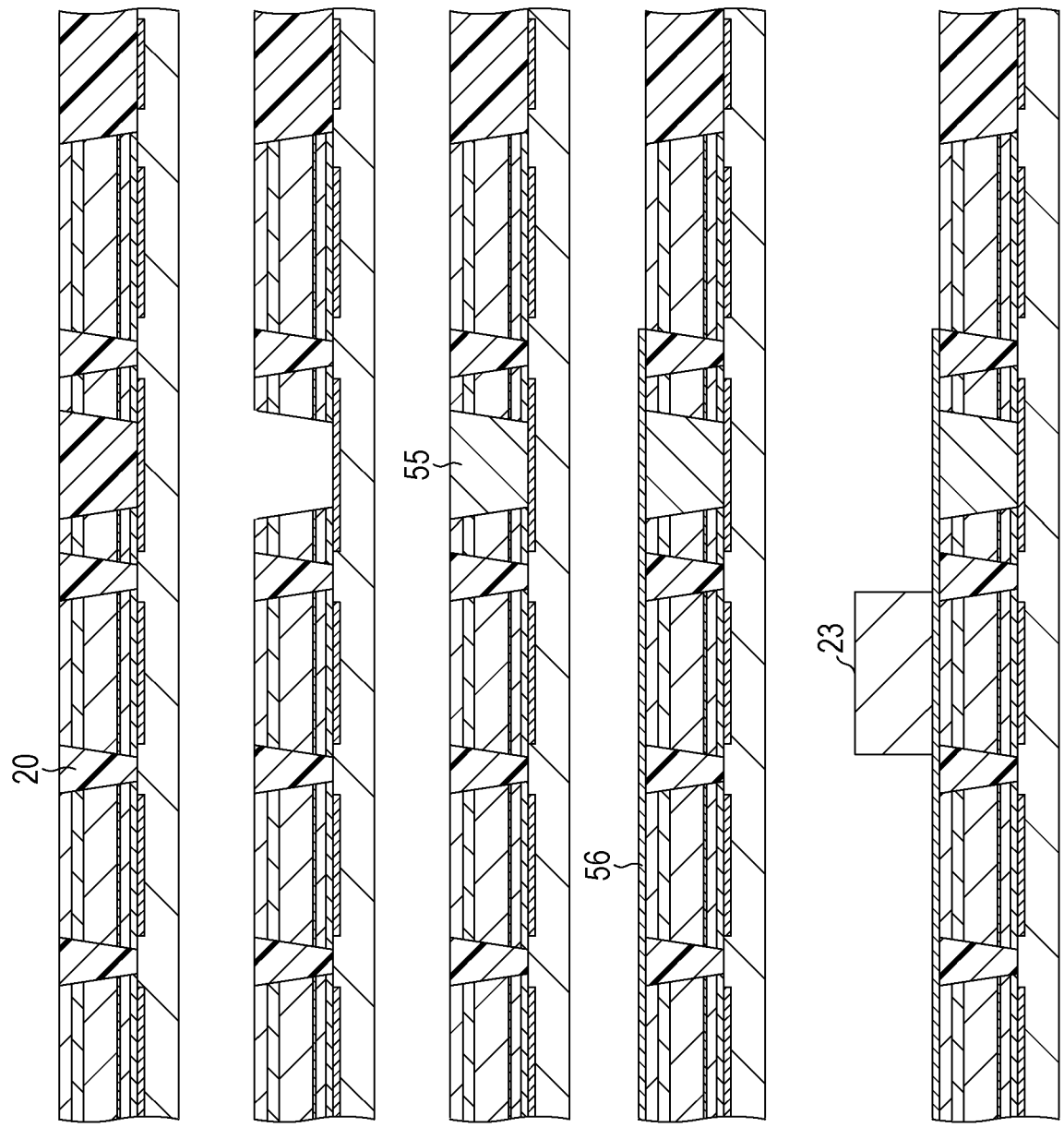

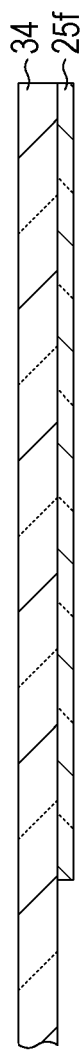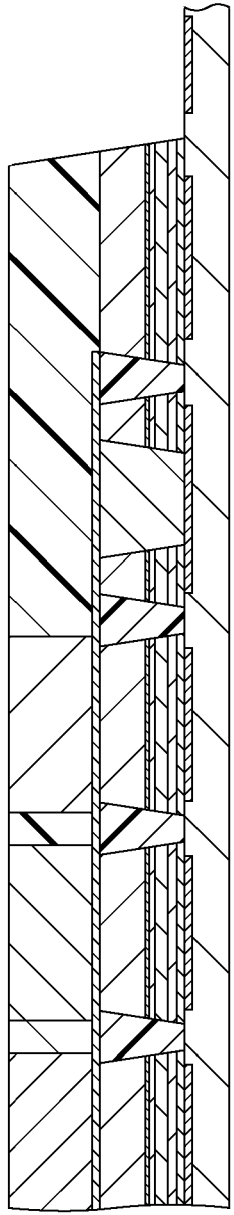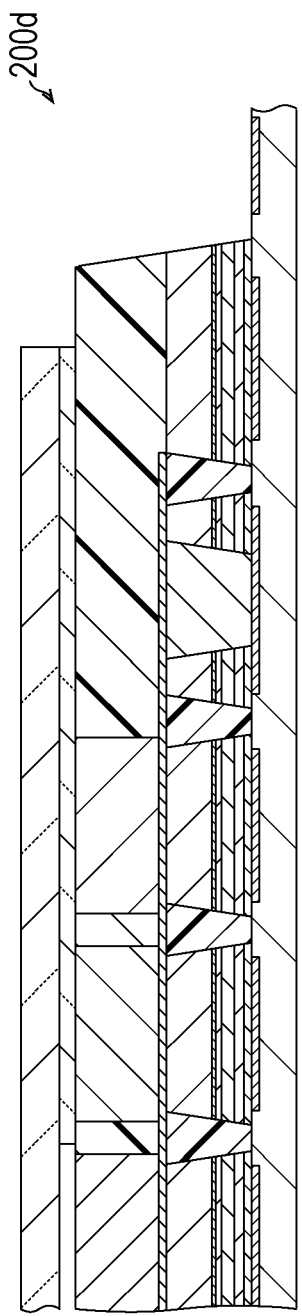
FIG. 9A  FIG. 9B

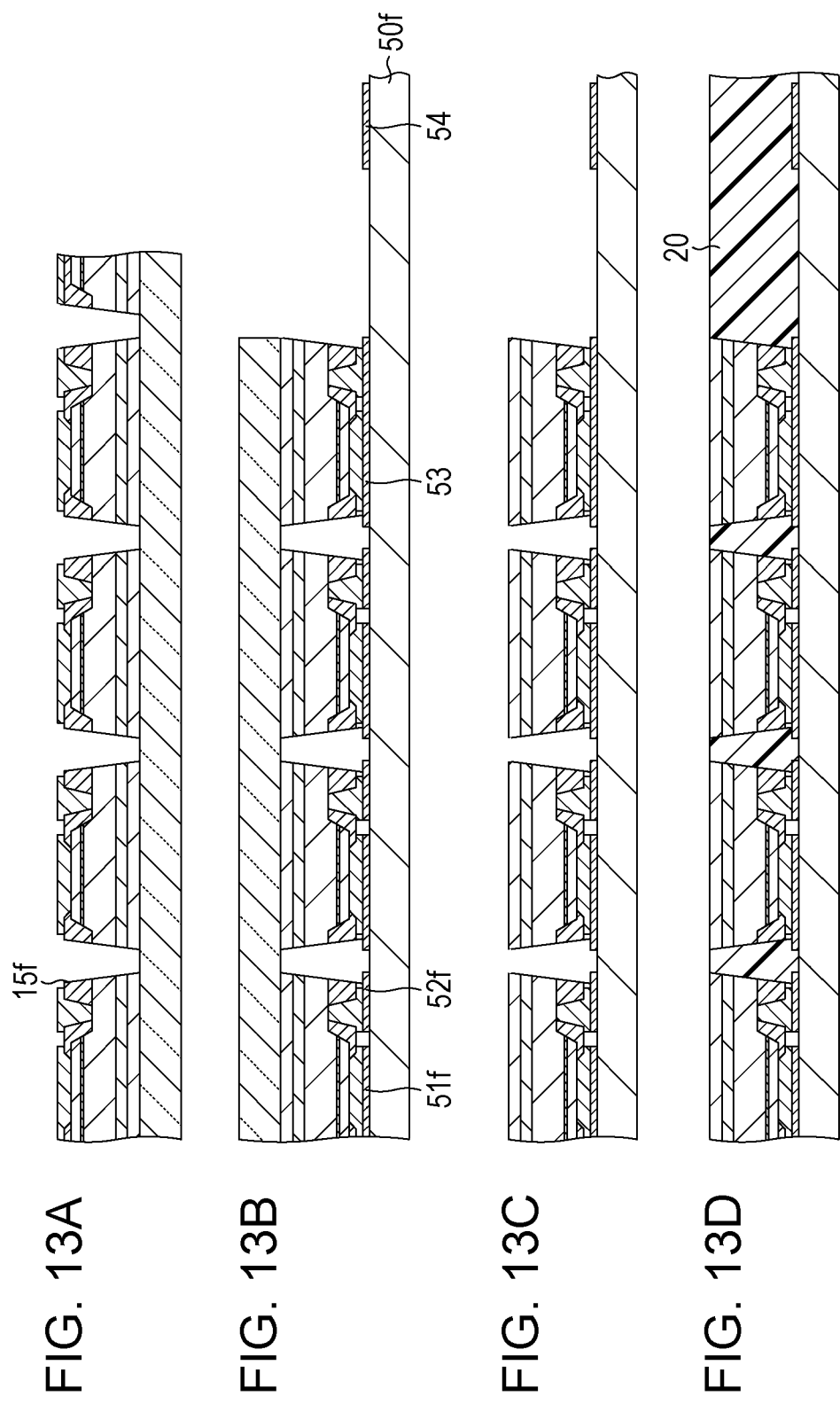

IMAGE DISPLAY DEVICE

BACKGROUND

1. Field

The present disclosure relates to an image display device including a plurality of micro LED elements, which are minute LED elements.

2. Description of the Related Art

There has been proposed a compact display device that displays a color image by forming a drive circuit on a silicon substrate, arranging a minute ultraviolet light-emitting diode (LED) array on the drive circuit, and disposing a wavelength conversion layer configured to convert ultraviolet light into visible light of red, green, and blue (refer to Japanese Unexamined Patent Application Publication No. 2002-141492 (published on May 17, 2002)). Such a display device has characteristics of high luminance and high durability while the display device is small in size, and is expected as a glasses-type terminal for AR (augmented reality) and a display device for a head-up display (HUD).

A structure relating to a liquid crystal display device has been disclosed in which, in an image display device, a band-pass filter that transmits blue light, which is light-source light, is arranged on the light source side, and phosphors that perform wavelength conversion and a color filter are stacked thereon (refer to International Publication No. 2010/143461 (published on Dec. 16, 2010)). In the disclosed structure, a gap between adjacent phosphors and color filters is filled with a black matrix, and the black matrix includes reflective bodies covering sidewalls and an absorbing body. This technology is based on a liquid crystal display device, and the target of the technology is a direct-view, large display device.

As a method for efficiently performing wavelength conversion by a phosphor, a configuration in which an excitation-light transmitting layer is disposed on the excitation light incident side of a wavelength conversion layer, and an excitation-light reflecting layer is disposed on the fluorescence emission side has been disclosed (refer to International Publication No. 2017/130607 (published on Aug. 3, 2017)). The target of this technology is a light source for illumination and is not an image display device.

However, in the related art described above, in order to cause large portion of the excitation light to be absorbed by the wavelength conversion layer to perform wavelength conversion, a wavelength conversion layer having a very large thickness is required, and it is very difficult to form a minute pattern of the wavelength conversion layer. In view of this, it is conceivable that in order to reduce the thickness of the wavelength conversion layer, a reflection layer that transmits the excitation light and that reflects light whose wavelength has been converted is disposed on the excitation light incident side of the wavelength conversion layer, and a transmission layer that reflects the excitation light and that transmits light whose wavelength has been converted is disposed on the emission side of the wavelength conversion layer. However, a dielectric multilayer film serving as such a reflection layer or a transmission layer has a complex structure, and it is difficult to form the dielectric multilayer film on an object other than a hard substrate having a high flatness. Accordingly, a technique for easily and stably producing a reflection layer, and furthermore, a technique for easily and stably producing an image display device including the reflection layer have been desired.

SUMMARY

An image display device according to an aspect of the disclosure includes a drive circuit substrate, micro LED elements, and a wavelength conversion layer that converts excitation light emitted from the micro LED elements and that emits converted long-wavelength light to a side opposite to the drive circuit substrate, the micro LED elements and the wavelength conversion layer being sequentially stacked on the drive circuit substrate. The micro LED elements include a first multilayer film that reflects the long-wavelength light converted by the wavelength conversion layer.

According to an aspect of the present disclosure, there is provided an image display device including a reflection layer that can be easily and stably produced.

BRIEF DESCRIPTION OF THE DRAWINGS

FIGS. 4A to 4E illustrate a process for producing a display device according to the first embodiment of the present disclosure (Part 2);

FIGS. 9A and 9B include sectional views of a display device according to a fourth embodiment of the present disclosure;

FIGS. 13A to 13D illustrate a process for producing a display device according to the sixth embodiment of the present disclosure (Part 2);

DESCRIPTION OF THE EMBODIMENTS

Related Art and Preliminary Configuration Examples

Figure 1:
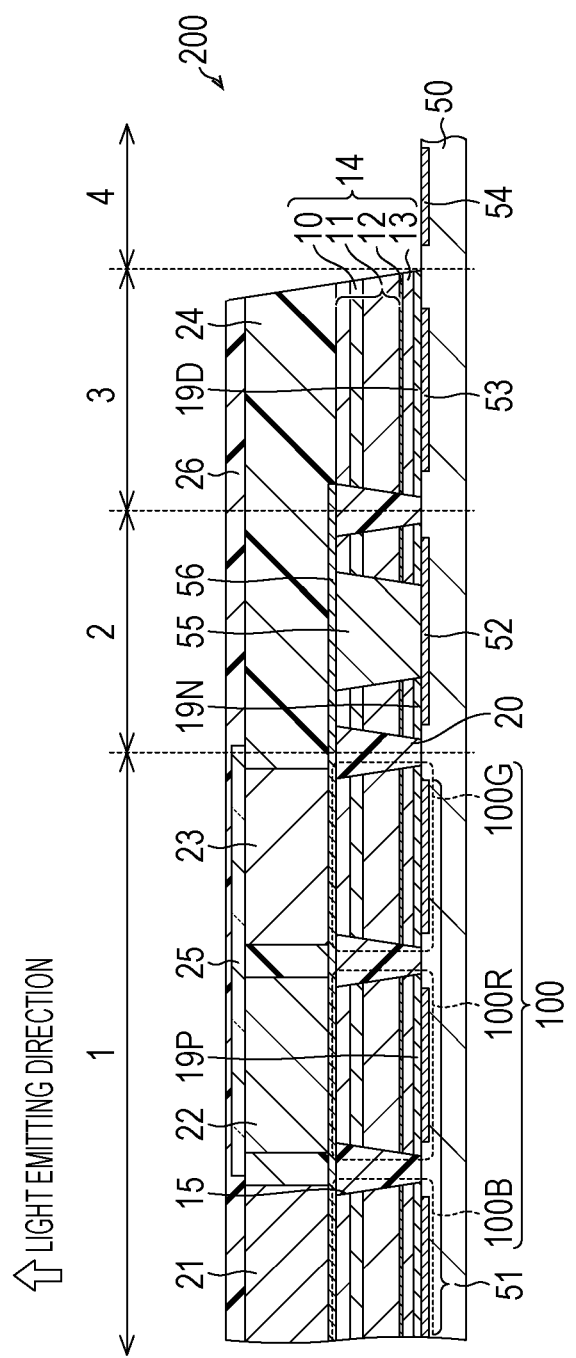
FIG. 1 is a sectional view of a display device according to a first embodiment of the present disclosure.

Prior to a specific description of an embodiment of the present disclosure, the related art and preliminary configuration examples will be summarized below.

The display device in the related art which is described in Japanese Unexamined Patent Application Publication No. 2002-141492 has already been practically used in a case that an organic EL (electroluminescence) is deposited as a light-emitting layer on a silicon substrate having a drive circuit thereon. However, there is room for improvement in terms of luminance and durability.

In the liquid crystal display device in the related art described in International Publication No. 2010/143461, a structure in which a gap between adjacent phosphors and color filters is filled with a black matrix, and the black matrix includes reflective bodies covering sidewalls and an absorbing body has been disclosed. This technology is based on a liquid crystal display device, and the target of the technology is a direct-view, large display device.

The target of the related art described in International Publication No. 2017/130607 is a light source for illumination and is not an image display device.

In the compact projection-type display device used in the glasses-type terminal for AR or the like, it is necessary to reduce the pixel size to about several micrometers in order to realize high resolution. On the other hand, in order to cause large portion of excitation light to be absorbed by a wavelength conversion layer to perform wavelength conversion, the thickness of the wavelength conversion layer is in the range of from several micrometers to more than 10 µm, resulting in an increase in an aspect ratio (ratio of height/width) of the wavelength conversion layer (for example, 2 or more), and thus it is very difficult to form a pattern of the wavelength conversion layer.

In order to facilitate the formation of a pattern of the wavelength conversion layer, it is preferable to reduce the thickness of the wavelength conversion layer. For this reason, the inventors of the present disclosure have studied an improvement in the conversion efficiency by disposing a layer (hereinafter referred to as a reflection layer) that transmits excitation light and that reflects long-wavelength light whose wavelength has been down-converted on the excitation light incident side of a wavelength conversion layer, and disposing a layer (hereinafter referred to as a transmission layer) that reflects the excitation light and that transmits the long-wavelength light whose wavelength has been down-converted on the emission side of the wavelength conversion layer to efficiently emit the long-wavelength light and to confine the excitation light in the wavelength conversion layer.

However, steps of forming the reflection layer and the transmission layer must be newly added, resulting in an increase in the number of production steps. In addition, such a transmission layer and a reflection layer are usually formed of dielectric multilayer films, and such dielectric multilayer films have a problem in that the films tend to degrade due to, for example, moisture absorption after deposition.

In particular, in the case of the reflection layer, it is necessary to perform a step of forming a wavelength conversion layer after deposition. Consequently, a plurality of wet steps are performed, and degradation of the reflection layer tends to occur in the production process. Furthermore, the reflection layer needs to efficiently reflect both red light and green light, and has a more complex structure than the transmission layer. A structure for producing such a complex reflection layer more simply and stably has been required. In particular, realization of a device structure capable of realizing a reflection layer having high durability is an important issue.

In view of the above, an image display device that is easily produced with a relatively small number of production steps is realized by the configuration of an image display device described in each embodiment below.

In the description of embodiments below, a detailed description relating to a drive circuit substrate 50 will be omitted. This is because an example of the drive circuit substrate 50 is a silicon substrate (semiconductor substrate) on which LSIs are formed, and can be produced by a known technique. In addition, a micro LED element (hereinafter also referred to as a micro LED or a micro light-emitting element) may have various planar shapes such as a rectangular shape, a polygonal shape, a circular shape, or an elliptical shape, and the longest length of the planar shape is assumed to be 60 µm or less. It is assumed that an image display device 200 includes 3,000 or more micro light-emitting elements integrated in a pixel region 1.

In the following, a description will be made of only a case where a micro LED element 100 is formed of a nitride semiconductor that emits light in a wavelength range from ultraviolet light to green. However, the micro LED element 100 can be replaced with an AlInGaP-based element that emits light in a wavelength range from yellowish green to red, or an AlGaAs-based or GaAs-based element that emits light in a wavelength range from red to infrared light.

In addition, a description will be made of only a configuration in which an N-side layer 11 is disposed on the light emission side of a nitride semiconductor layer 14 that forms the micro LED element 100. Alternatively, a configuration in which a P-side layer 13 is disposed on the light emission side may also be used. Each of the N-side layer 11, a light emission layer 12, and the P-side layer 13 is usually not a single layer but is optimized by including a plurality of layers. However, such structures do not directly relate to the configuration of the present disclosure, and thus the detailed structure of each layer is not described. While the light emission layer is generally disposed between an N-type layer and a P-type layer, the N-type layer and the P-type layer may include non-doped layers or layers having dopants with opposite conductivity. Therefore, the layers that sandwich the light emission layer therebetween are hereinafter described as an N-side layer and a P-side layer.

First Embodiment

Figure 2:
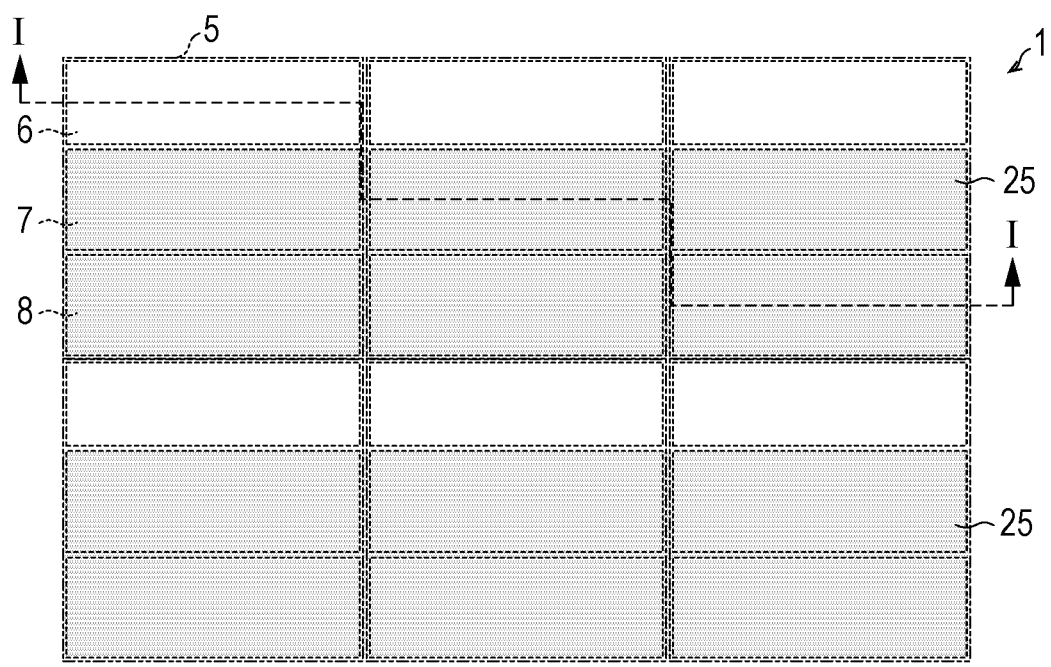
FIG. 2 is a top view of a pixel region of a display device according to the first embodiment of the present disclosure.

Hereinafter, an image display device 200 according to a first embodiment of the present disclosure, the image display device 200 having micro LED elements 100 as a light source thereon, will be described with reference to FIGS. 1 to 6B. FIG. 1 is a sectional view of an image display device 200 including a plurality of micro LED elements 100. FIG. 2 is a top view of a pixel region of the image display device 200. FIGS. 3A to 6B are sectional views illustrating a process for producing the micro LED elements 100 and the image display device 200.
Overall Configuration As illustrated in FIG. 1, an image display device 200 includes a pixel region 1, a common interconnection region 2, a dummy region 3, and a peripheral region 4. In the pixel region 1, pixels 5 are arranged in an array, and each of the pixels 5 includes a blue sub-pixel 6, a red sub-pixel 7, and a green sub-pixel 8 as illustrated in FIG. 2. The blue sub-pixel 6, the red sub-pixel 7, and the green sub-pixel 8 emit blue light, red light, and green light, respectively, and light having various colors can be emitted as the pixel 5 by adjusting the intensities of the respective types of light. FIG. 1 illustrates a sectional view taken along line I-I in FIG. 2. The blue sub-pixel 6, the red sub-pixel 7, and the green sub-pixel 8 include micro LEDs 100B, 100R, and 100G, respectively. The micro LEDs 100B, 100R, and 100G have the same structure and emit blue light (excitation light). Hereinafter, in the case where all the micro LEDs 100B, 100R, and 100G are collectively denoted, the micro LEDs 100B, 100R, and 100G are referred to as micro LEDs 100. In FIG. 2, the pixels each have a square shape, and the sub-pixels each have a rectangular shape with longer sides having the same length as the pixels. However, the shape of the pixels and the shape of the sub-pixels may be other shapes, and the sub-pixels are not limited to the three types of blue, red, and green.

The micro LED elements 100B, 100R, and 100G each include a nitride semiconductor layer 14, a P-electrode 19P (first electrode), and a common N-electrode 56 (second electrode). The common N-electrode 56 is disposed on the light emission surface side, and the P-electrode 19P is disposed on the drive circuit substrate 50 side. The P-electrode 19P is connected to a P-drive electrode 51 on the drive circuit substrate 50. The common N-electrode 56 is connected to an N-drive electrode 52 on the drive circuit substrate 50 through a plug 55 in the common interconnection region 2. The micro LED elements 100 are supplied with a current from the corresponding P-drive electrodes 51 to emit light. The light is emitted in a direction opposite to the direction toward the drive circuit substrate 50, that is, in the direction toward the common N-electrode 56 side. The micro LEDs 100B, 100R, and 100G individually divided by a pixel isolation trench 15, and the pixel isolation trench 15 is filled with a filling material 20. The isolation of the micro LED elements 100 is desirable from the viewpoint of preventing light crosstalk between pixels. When the nitride semiconductor layers 14 is connected between adjacent micro LED elements 100, light generated in any of the micro LED elements 100 is emitted from the adjacent pixel to the outside through the nitride semiconductor layer 14 (light crosstalk). Light crosstalk decreases the contrast and color purity of a display image, and thus is not preferable. The filling material 20 prevents light crosstalk and planarizes the surface to facilitate the formation of the common N-electrode 56 and wavelength conversion portions and a light convergence portion on the common N-electrode 56.

The peripheral region 4 defines the outer edge of the image display device 200 and includes a scribe region for cutting the image display device 200 into individual pieces and a connection portion for connecting to an external circuit, such as a wire-bonding pad. In the peripheral region 4, the nitride semiconductor layer 14 has been removed. The dummy region 3 is a region other than the pixel region 1, the common interconnection region 2, and the peripheral region 4 of the image display device 200. Although no light is emitted, the nitride semiconductor layer 14 is disposed in this region so as to ensure flatness of the surface.

In the pixel region 1 of the drive circuit substrate 50, pixel driving circuits for respective pixels are arranged. Mainly in the dummy region 3, a row selection circuit, a column signal output circuit, an image processing circuit, an input-output circuit, and other circuits are arranged. A dummy-drive electrode 53 on the drive circuit substrate 50 is disposed to fix the nitride semiconductor layer 14 and keep light from entering these circuits.
Configuration of Pixels The blue sub-pixel 6 has, on the common N-electrode 56, a transparent portion 21 formed of a transparent resin pattern that contains scattering particles, and the emission direction of blue light emitted from the micro LED 1008 is broadened by the scattering particles. However, the blue sub-pixel 6 emits the blue light to the outside as it is without performing wavelength conversion. The transparent portion 21 need not contain scattering particles. The transparent portion 21 increases the blue light emission compared with the case without the transparent portion 21. If the transparent portion 21 is not there, the blue light goes to air directly from the nitride semiconductor layer 14 so that the blue light emission decreases due to larger difference of refractive index than the case that the transparent portion 21 exists. The red sub-pixel 7 has a red wavelength conversion portion 22 which is a resin pattern containing a material that performs wavelength conversion from the blue light emitted from the micro LED 100R to red light (long-wavelength light), and emits red light. The green sub-pixel 8 has a green wavelength conversion portion 23 which is a resin pattern containing a material that performs wavelength conversion from the blue light emitted from the micro LED 100G to green light (long-wavelength light), and emits green light.

The micro LEDs 100B, 100R, and 100G include the nitride semiconductor layer 14. The nitride semiconductor layer 14 includes, from the light emission surface side, an N-side layer 11, a light emission layer 12, and a P-side layer 13 in that order, and a reflection layer 10 is included inside the N-side layer 11. The reflection layer 10 may be disposed on an end portion of the N-side layer 11, and such a case is also included in the case where "the reflection layer 10 is included inside the N-side layer 11". In the present embodiment, the reflection layer 10 is included inside the nitride semiconductor layer 14 and is disposed on the wavelength conversion layer side with respect to the light emission layer 12.

According to the above configuration, since the reflection layer 10 is included inside the N-side layer 11, the reflection layer 10 can be easily produced. The reason for this is as follows. For example, even when micro LEDs 100 that do not include a reflection layer 10 are formed on the drive circuit substrate 50, and a reflection layer 10 is then formed on the micro LEDs 100, the same effects as those of the present embodiment can be achieved. In this case, however, a step of depositing the reflection layer 10 and a step of dividing the reflection layer 10 for each micro LEDs 100 are additionally required. In addition, a step of filling gaps between divided portions of the reflection layer 10 is also necessary. These steps are not necessary when the reflection layer 10 is included inside the N-side layer 11. Accordingly, the reflection layer 10 is preferably included inside the N-side layer 11. However, for example, in small-volume production in which the increase in the number of steps does not cause a problem, the reflection layer 10 may be formed after the formation of the micro LEDs 100.

As described above, the image display device 200 is an image display device 200 including a drive circuit substrate 50, micro LED elements 100, and a red wavelength conversion portion 22 and a green wavelength conversion portion 23 (wavelength conversion layers) that convert light emitted from the micro LED elements 100 and that emit converted light to a side opposite to the drive circuit substrate 50, the micro LED elements 100, the red wavelength conversion portion 22, and the green wavelength conversion portion 23 (wavelength conversion layers) being sequentially stacked on the drive circuit substrate 50. The micro LED elements 100 include a reflection layer (first multilayer film) 10 that reflects the light down-converted by the wavelength conversion layers.

According to the above configuration, since the reflection layer 10 is made of a nitride semiconductor, the reflection layer 10 is very stable, and degradation in the subsequent process is suppressed. In addition, the reflection layer 10 can be easily formed. Accordingly, the reflection layer 10 can be easily and stably produced. This configuration also has an advantage that light crosstalk is not increased. In the case where a reflection layer is disposed between the micro LEDs 100 and the wavelength conversion portions 22 and 23 without dividing the reflection layer for each micro LED 100, light crosstalk is generated through the reflection layer. However, since the reflection layer 10 is formed inside the micro LEDs 100 in this configuration, additional light crosstalk is not generated.

As described above, in the image display device 200, the micro LED elements 100 emit blue light, and the red wavelength conversion portion 22 and the green wavelength conversion portion 23 (wavelength conversion layers) convert the blue light into long-wavelength light (red light and green light).

According to the above configuration, the image display device 200 emits, for example, blue light as an example of excitation light and can further convert the blue light into long-wavelength light such as red light and green light with the wavelength conversion layers.

The reflection layer 10 (first multilayer film) is formed of a multilayer structure of nitride semiconductor materials and has a characteristic of transmitting blue light (excitation light) and reflecting light (long-wavelength light) having longer wavelengths than blue light.

According to the above configuration, since the reflection layer 10 includes nitride semiconductor materials, the reflection layer 10 is very stable, and degradation of the reflection layer 10 does not occur in the subsequent process.

The reflection layer 10 (first multilayer film) has high reflection properties at least in the green region (for example, wavelength: 520 nm±15 nm) and the red region (for example, wavelength: 630 nm±15 nm). In the red sub-pixel 7, part of red light generated by the red wavelength conversion portion 22 is incident on the micro LED 100R, but is reflected at the reflection layer 10, transmitted again through the red wavelength conversion portion 22, and emitted to the outside. In the case where the reflection layer 10 is not provided, the red light incident on the micro LED 100R is repeatedly reflected at the interface between the P-electrode 19P and the P-side layer 13 and at sidewalls of the nitride semiconductor layer 14, and considerable portion (25% or more) of the red light is absorbed inside the micro LED 100R. The reflectance of visible light at a nitride semiconductor/metal electrode interface is generally low, and thus the loss is large. Only when the metal electrode is made of silver, the reflectance of visible light is 90% or more. However, it is difficult to establish an ohmic contact with the P-layer, and silver tends to cause failures due to migration. Thus, it is difficult to apply silver to the structure as illustrated in FIG. 1. In the case where palladium, which easily establishes an ohmic contact, is used as the P-electrode 19P, the reflectance is only approximately 50%. Even when a composite layer of Ni/ITO is used as the P-electrode 19P, the reflectance is about 50% or less. In the case where a light-absorbing material is used for the filling material 20 in order to keep light from entering to adjacent micro LEDs 100, light is strongly absorbed by the sidewalls of the nitride semiconductor layer 14, and red-light absorption inside the micro LED 100R further increases. Accordingly, in reality, it is necessary to increase the reflectance by using the reflection layer 10 formed of a multilayer film as described above. As a result, the red-light extraction efficiency can be improved, and the red-light emission efficiency can be enhanced. This also applies to the green sub-pixel 8.

It is not necessary that the reflection layer 10 have a high reflectance over the entire region of a wavelength that is longer than that of blue light, and, in some cases, the reflection layer 10 preferably has peak reflectances in the green region and the red region. In some cases, the red wavelength conversion portion 22 and the green wavelength conversion portion 23 have broad light emission peaks. In such a case, the spectra of long-wavelength light emitted from the respective wavelength conversion portions are formed to be sharp by strongly reflecting light in the green region and the red region. As a result, the color purity can be enhanced. The peak value of the reflectance is preferably 70% or more.

In the red sub-pixel 7 and the green sub-pixel 8, a transmission layer 25 is disposed on the red wavelength conversion portion 22 and the green wavelength conversion portion 23. The transmission layer 25 has a characteristic of reflecting blue light (excitation light) and transmitting light (long-wavelength light) having a longer wavelength than blue light.

The transmission layer 25 is formed of, for example, a dielectric multilayer film including a titanium oxide thin film and a silicon dioxide thin film. In the red sub-pixel 7, red light generated by the red wavelength conversion portion 22 is transmitted through the transmission layer 25 and emitted to the outside. However, blue light is reflected at the transmission layer 25 and returned to the red wavelength conversion portion 22, and thus is absorbed again in the red wavelength conversion portion 22. Light that has traveled to the micro LED 100R side without being absorbed by the red wavelength conversion portion 22 is transmitted through the reflection layer 10 and incident on the P-electrode 19P/P-side layer 13 interface. Accordingly, since the blue light is confined between the transmission layer 25 and the P-electrode 19P/P-side layer 13 interface, the amount of blue light emitted to the outside is extremely small. In addition, while blue light passes through the red wavelength conversion portion 22 a number of times, wavelength conversion proceeds, and the conversion efficiency increases. Thus, the emission of blue light to the outside can be reduced by providing the transmission layer 25 to enhance the conversion efficiency in the red wavelength conversion portion 22. The thickness of the red wavelength conversion portion 22 can be further reduced by using this effect. This also applies to the green sub-pixel 8.

In other words, since the transmission layer 25 can reflect blue light and transmit light having a longer wavelength than the blue light, emission of the blue light from the red sub-pixel 7 and the green sub-pixel 8 is prevented, and the blue light can be efficiently subjected to wavelength conversion. As a result, color purities of the red sub-pixel 7 and the green sub-pixel 8 improve, and the light emission efficiency of the image display device 200 can be improved. Furthermore, the reduction in the thickness of the wavelength conversion layer facilitates the production.

Since the dielectric multilayer film constituting the transmission layer 25 has high hygroscopicity and easily degrades, the whole of the dielectric multilayer film is preferably covered with a passivation film 26. The passivation film 26 may be a CVD film such as a silicon nitride film or made of a resin material such as a silicone resin.

Production Method

Next, an example of a method for producing micro LED elements 100 will be described with reference to FIGS. 3A to 6B.

Figure 3A:
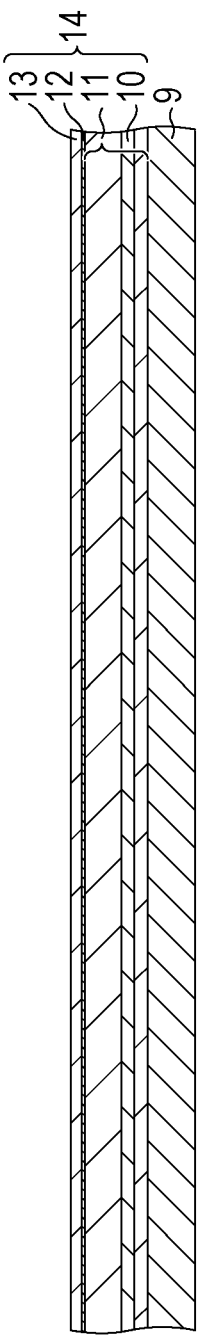
FIGS. 3A to 3E illustrate a process for producing a display device according to the first embodiment of the present disclosure (Part 1)

As illustrated in FIG. 3A, an N-side layer 11, a light emission layer 12, and a P-side layer 13 are deposited on a growth substrate 9 in that order to form a nitride semiconductor layer 14. The N-side layer 11 includes a reflection layer 10. As the growth substrate 9, for example, a (111) plane silicon substrate can be used. In particular, the growth substrate 9 preferably has the same size as a drive circuit substrate 50. The growth substrate 9 may be made of, for example, sapphire ($Al_2O_3$) or SiC. As a material of the nitride semiconductor layer 14, for example, a GaN-based semiconductor can be used. As an apparatus for growing the nitride semiconductor layer 14 on the growth substrate 9, for example, an MOCVD apparatus can be used. The growth substrate 9 may have a surface with an uneven structure. In the case where the growth substrate 9 has a surface with an uneven structure, preferably, the surface is once planarized by epitaxial growth, and the reflection layer 10 is then grown. Preferably, the N-side layer 11 does not include a high-resistance layer therein because it is necessary to allow a current to flow in a thickness direction thereof, and the N-side layer 11 is preferably an N-type good conductor across the layer thickness direction. The reflection layer 10 in this configuration is included in the N-side layer and thus has N-type conductivity. In addition, the warp of the growth substrate 9 is preferably small at a stage at which the nitride semiconductor layer 14 is formed on the growth substrate 9 and the temperature of the resulting growth substrate 9 is returned to room temperature. In the case of an 8-inch wafer, the warp is preferably 35 μm or less in order to facilitate bonding to the drive circuit substrate 50 (step illustrated in FIG. 3C described later). Such a reduction in the warp can be realized by providing a suitable buffer layer in the N-side layer 11.

The light emission layer 12 includes a multi-quantum well layer including an InGaN layer and a GaN layer. The N-side layer 11 and the P-side layer 13 each have a multilayer structure including various layers. In the present embodiment, specific configurations of the N-side layer 11, the light emission layer 12, and the P-side layer 13 are not particularly limited, and, for example, configurations of an N-side layer, a light emission layer, and a P-side layer used in existing LED elements can be appropriately employed. Accordingly, in the present embodiment, the description of the specific configurations of the N-side layer 11, the light emission layer 12, and the P-side layer 13 is omitted.

Figure 22:
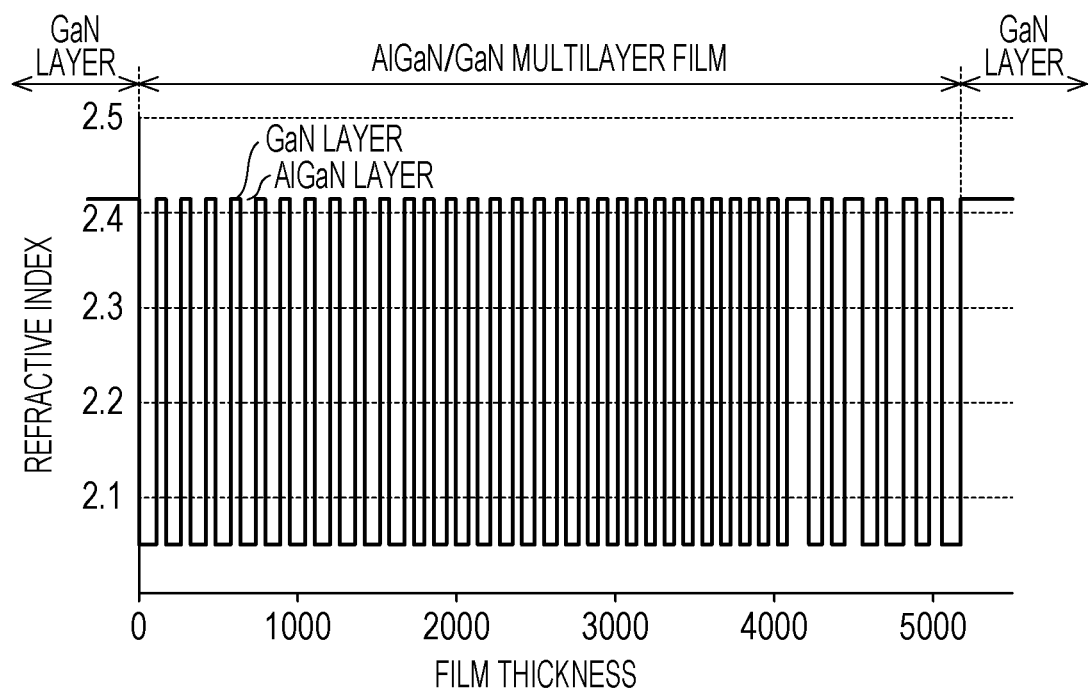
FIG. 22 is a schematic view illustrating the structure of a nitride semiconductor multilayer film constituting a reflection layer.

The reflection layer 10 can be formed by, for example, stacking a plurality of pairs of an $Al_xGa_{(1-x)}N$ layer and a GaN layer as illustrated in FIG. 22. The total number of the $Al_xGa_{(1-x)}N$ layers is 36, and the thickness of each of the layers is about 57 nm to 122 nm. Thirty five GaN layers are included between the $Al_xGa_{(1-x)}N$ layers, and the thickness of each of the layers is about 53 nm to 114 nm. The reflection layer 10 had a total film thickness of about 5.2 μm. With this structure, a reflectance of 65% or more was ensured at a wavelength of 520 nm, and a reflectance of 80% or more was ensured at a wavelength of 630 nm.

A thickness $t_n$ of the N-side layer 11 is generally 10 μm or less and is about 5 μm±2 μm in many cases. A thickness $t_{mqw}$ of the light emission layer 12 is generally 10 nm or more and 200 nm or less and is about 50 nm or more and 100 nm or less in many cases. A thickness $t_p$ of the P-side layer 13 is generally 50 nm or more and 1,000 nm or less and is about 100 nm or more and 300 nm or less in many cases.

Figure 3B:
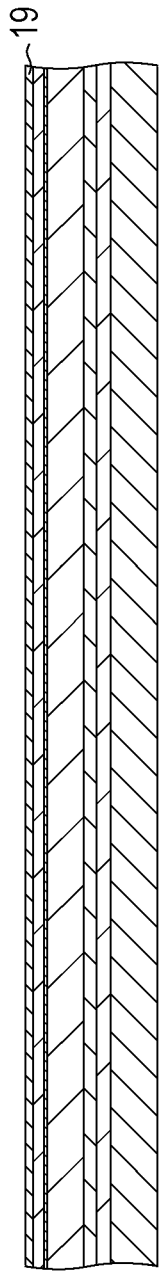

As illustrated in FIG. 3B, a P-electrode layer 19 is formed over the entire surface of the P-side layer 13. At this stage, the P-electrode layer 19 is formed over the entire surface of the wafer serving as the growth substrate 9 and is not patterned. Examples of the suitable P-electrode layer 19 include a metal thin film such as a palladium film, which easily establishes an ohmic contact with the P-side layer; a metal multilayer film including an aluminum thin film and a palladium film that has a thickness of about 5 nm and that is disposed at the interface; and a multilayer film including an ITO (indium tin oxide) film serving as a transparent electrode, nickel, and aluminum, on the P-side layer side. It is also preferable for the P-electrode layer 19 to have a gold or copper layer on the surface side, which is suitable for connecting to a P-drive electrode 51 on the drive circuit substrate 50.

Figure 3C:
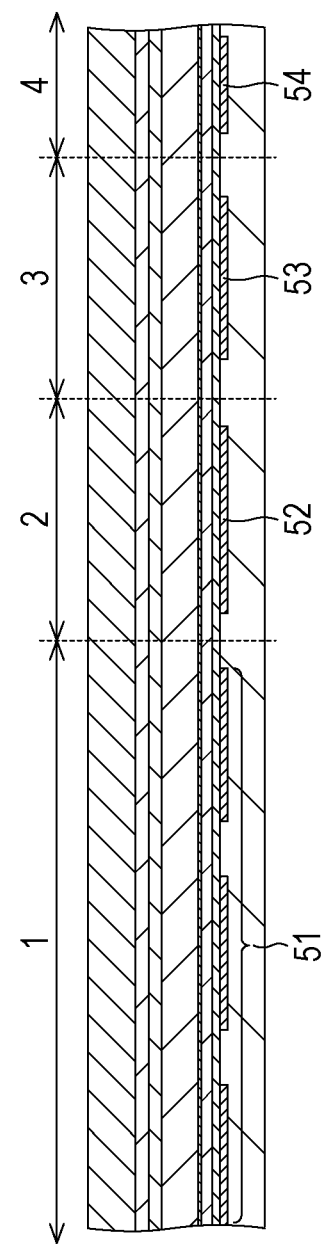

As illustrated in FIG. 3C, the growth substrate 9 in which the P-electrode layer 19 is formed on the nitride semiconductor layer 14 is bonded to a drive circuit substrate 50 such that the surface of the P-electrode layer 19 side faces the drive circuit substrate 50. A driving circuit of the image display device 200 is formed in the drive circuit substrate 50. The driving circuit substrate 50 includes electric circuits such as a pixel driving circuit configured to drive each of the micro LED elements 100, a row selection circuit configured to select a specific row of pixels arranged in a two-dimensional array, a column signal output circuit configured to output a light emission intensity signal in a specific column, and an image processing circuit. On the surface of the drive circuit substrate 50, P-drive electrodes 51 configured to supply a current to the respective micro LED elements 100 are exposed in the pixel region 1, an N-drive electrode 52 is exposed in the common interconnection region 2, a dummy-drive electrode 53 is exposed in the dummy region 3, and an I/O-electrode (external connection electrode) 54 is exposed in the peripheral region 4. FIGS. 3A to 3E each show a schematic sectional view of one image display device 200, but the steps are actually performed in a state of a substrate on which a plurality of image display devices 200 are arranged. The drive circuit substrate 50 is, for example, an 8-inch silicon substrate, and several hundred driving circuits of the image display devices 200 are arranged on the substrate. By this bonding, the P-drive electrode 51, the N-drive electrode 52, the dummy-drive electrode 53, and the I/O-electrode 54 on the drive circuit substrate 50 are connected to the P-electrode layer 19. In this case, the bonding may be performed by connecting the metal electrodes (for example, copper) together either directly or with metal nanoparticles serving as an adhesive layer therebetween. In this bonding step, precise alignment is not necessary. In the case of bonding wafers to each other, it is enough that the wafers overlap with each other. In order to avoid stress caused by expansion and contraction due to heating and cooling at the time of bonding, the growth substrate 9 and the drive circuit substrate 50 are preferably made of the same material. In particular, the materials of the growth substrate 9 and the driving circuit substrate 50 are each preferably silicon.

Figure 3D:
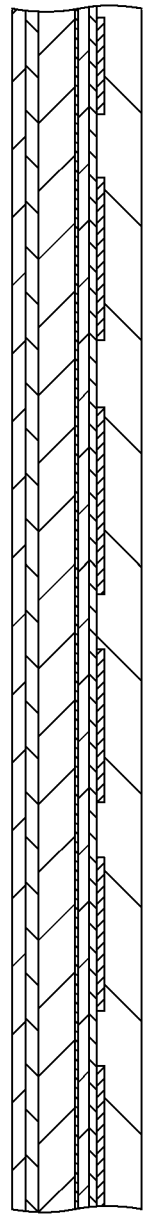

Next, in the step in FIG. 3D, the growth substrate 9 is separated. In the case of a silicon substrate, the growth substrate 9 can be removed by a combination of, for example, grinding, polishing, plasma etching, and wet etching. In the step illustrated in FIG. 3C, the nitride semiconductor layer 14 is bonded to the drive circuit substrate 50 in the state where the growth substrate 9 remains. Alternatively, the nitride semiconductor layer 14 may be bonded to the drive circuit substrate 50 after the nitride semiconductor layer 14 is temporarily transferred onto another substrate (transfer substrate), and the transfer substrate may be separated.

Figure 3E:
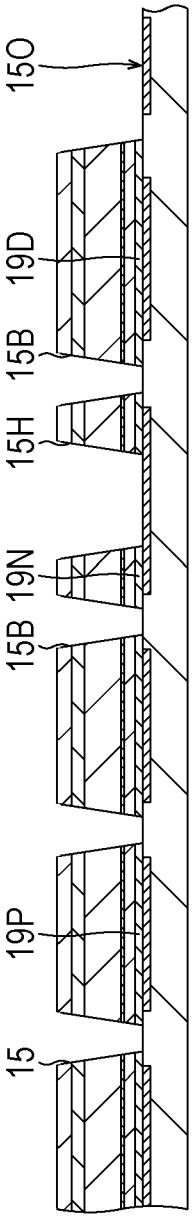

Subsequently, a pixel isolation trench 15 is formed as illustrated in FIG. 3E. The pixel isolation trench 15 is a trench that is formed by etching at least layers from the nitride semiconductor layer 14 to the P-electrode layer 19 and that divides the layers. In the pixel region 1, the micro LED elements 100 are individually divided by the pixel isolation trench 15. The reflection layer 10 is also divided by the pixel isolation trench 15 for each micro LED element 100. The P-electrode layer 19 in the pixel region 1 serves as a P-electrode 19P that is connected to the P-side layer 13 of the corresponding micro LED element 100. A boundary trench 15B is simultaneously formed at each boundary between the pixel region 1 and the common interconnection region 2, and between the common interconnection region 2 and the dummy region 3. The common interconnection region 2 and the dummy region 3 may further be divided into small pieces by the boundary trench 15B. The P-electrode layer 19 in the common interconnection region 2 serves as an N-electrode 19N that is connected to the N-drive electrode 52, and the P-electrode layer 19 in the dummy region 3 serves as a dummy P-electrode 19D. In the peripheral region 4, the nitride semiconductor layer 14 and the P-electrode layer 19 are removed (exposed region 150), and the I/O-electrode 54 is exposed. In the common interconnection region 2, a common electrode contact hole 15H is formed on the N-drive electrode 52.

In the sectional view of FIG. 3E, the sectional shape of the pixel isolation trench 15 is preferably a forward tapered shape formed by sidewalls of each of the micro LED elements 100. This is because the pixel isolation trench 15 is easily filled in a step of forming a filling material 20 in the subsequent process. If the sectional shape is a reverse tapered shape, bubbles or voids tend to remain on the sidewalls, and variations in the light output tend to occur. However, in the case where the taper angle greatly deviates from 90 degrees, the area of the light emission layer 12 is decreased. Thus, the taper angle is preferably in the range of from 70 degrees to 110 degrees.

The processing in steps subsequent to this step is performed on the drive circuit substrate 50, and each patterning is performed with precise alignment with respect to the drive circuit substrate 50. In this process, the step of forming the pixel isolation trench 15 and the boundary trench 15B, and the step of forming the exposed region 150 and the common electrode contact hole 15H may be separately performed.

Subsequently, as illustrated in FIG. 4A, the pixel isolation trench 15 is filled with a filling material 20, and the nitride semiconductor layer 14 is exposed. At the same time, the boundary trench 15B, the common electrode contact hole 15H, and the exposed region 150 are also filled with the filling material 20. The filling material 20 is a layer having a main object of planarizing the surface for formation of a common N-electrode in the subsequent process. The filling material 20 may be a resin material or a CVD film. The filling material 20 may be a resin to which a pigment that absorbs light, carbon black, or the like is added so as to prevent light from leaking to adjacent pixels. Alternatively, the filling material 20 may be a resin to which a white pigment serving as a reflective material or scattering particles are added so that the reflection is reinforced to improve the light output of the micro LED elements 100. Alternatively, leakage of light to adjacent pixels may be prevented by disposing a layered structure that includes a transparent insulating film and a metal film having a high reflectance on a sidewall of the pixel isolation trench 15.

Subsequently, as illustrated in FIG. 43, the filling material 20 in the common electrode contact hole 15H is removed, and as illustrated in FIG. 4C, the common electrode contact hole 15H is filled with a plug 55. The plug 55 may be made of a material such as tungsten. Furthermore, as illustrated in FIG. 4D, a common N-electrode 56 is formed. The common N-electrode 56 may be a transparent conductive film, such as ITO, a metal mesh electrode having an opening corresponding to a large portion of the nitride semiconductor layer 14 and a metal thin film pattern disposed above the pixel isolation trench 15, or a combination of these. In the case of the mesh electrode, the mesh electrode may also function as a planarization portion 24 described below. The common N-electrode 56 is connected to the N-side layer 11 of the micro LED elements 100, and is connected to the N-drive electrode 52 through the plug 55 in the common interconnection region.

Next, as illustrated in FIG. 4E, a green wavelength conversion portion 23 is formed on a green sub-pixel 8. This step can be performed by a photolithography technique using a negative resist mixed with wavelength conversion particles. Alternatively, the green wavelength conversion portion 23 can be formed by forming a mold using a positive resist, applying thereon a resin mixed with wavelength conversion particles and scattering particles to fill the recess, removing the resin material remaining on the flat portion, and further removing the positive resist material. The wavelength conversion particles may be phosphor particles, quantum dots, or quantum rods.

Figure 5A:
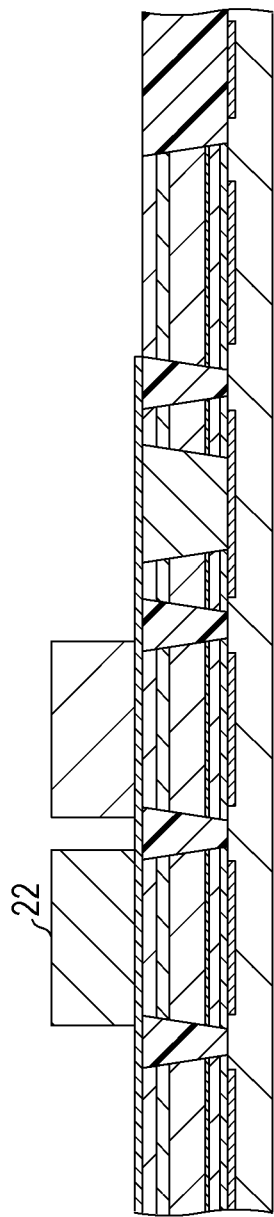
FIGS. 5A to 5D illustrate a process for producing a display device according to the first embodiment of the present disclosure (Part 3)
Figure 5B:
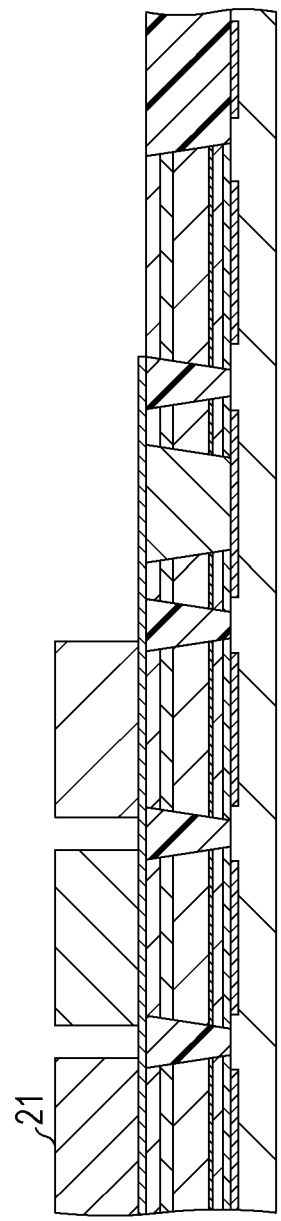

Similarly, as illustrated in FIGS. 5A and 5B, a red wavelength conversion portion 22 and a transparent portion 21 are formed on a red sub-pixel 7 and a blue sub-pixel 6, respectively. The green wavelength conversion portion 23, the red wavelength conversion portion 22, and the transparent portion 21 preferably have substantially the same thickness. This is because when the thicknesses of the wavelength conversion portions and the transparent portion in the sub-pixels are different from each other, the difference in light-emission-distribution characteristics among the sub-pixels increases, resulting in a problem in that the color varies depending on the viewing direction. In addition, there is also an advantage of ensuring flatness of the surface and facilitating the formation of a transmission layer 25 and a passivation film 26 in the subsequent process.

Figure 5C:
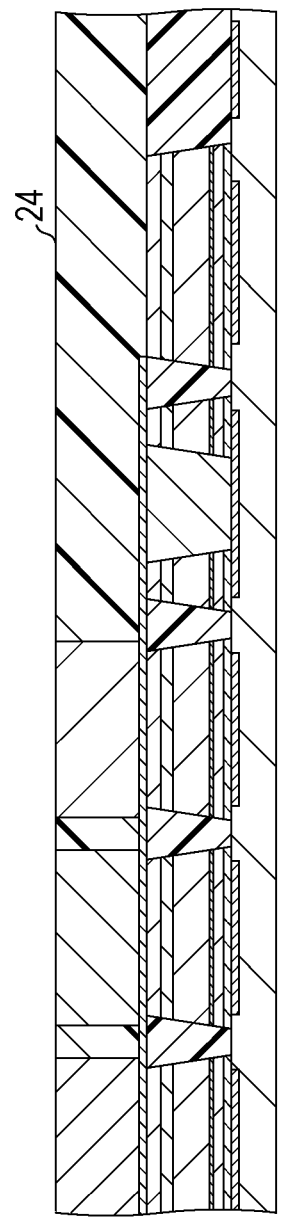

Subsequently, as illustrated in FIG. 5C, a planarization portion 24 is formed. The planarization portion 24 is formed for the purpose of filling gaps between the green wavelength conversion portion 23, the red wavelength conversion portion 22, and the transparent portion 21 in the pixel region 1 to planarize the surface and planarizing regions other than the pixel region 1 to facilitate the formation of a transmission layer 25 and a passivation film 26 in the subsequent process. The planarization portion 24 is formed of a resin material and may be formed of a resin to which a pigment that absorbs light, carbon black, or the like is added so as to prevent light from leaking to adjacent sub-pixels. In contrast, the planarization portion 24 may be a resin to which a white pigment serving as a reflective material or scattering particles are added so that the reflection is reinforced to improve the light output of the sub-pixels. That is, the planarization portion 24 is a light-shielding material that prevents light from leaking to adjacent sub-pixels by light absorption or reflection.

In the present embodiment, after the formation of the green wavelength conversion portion 23, the red wavelength conversion portion 22, and the transparent portion 21, the planarization portion 24 is formed. Alternatively, the mold described above may be formed, the green wavelength conversion portion 23, the red wavelength conversion portion 22, and the transparent portion 21 may be subsequently formed, and the mold may be left to function as the planarization portion 24. In this case, after the formation of the planarization portion 24, recesses are formed in regions where the green wavelength conversion portion 23, the red wavelength conversion portion 22, and the transparent portion 21 are to be formed, and the green wavelength conversion portion 23, the red wavelength conversion portion 22, and the transparent portion 21 are subsequently formed in the recesses. The planarization portion 24 may be formed of a transparent resin material whose surface is covered with a metal film or a metal material besides the resin material described above. In such a case, the metal film or the metal material is preferably silver or aluminum, which has a high reflectance.

The planarization portion 24 is preferably disposed above the filling material 20 as illustrated in FIG. 1. In other words, preferably, the transparent portion 21 and the wavelength conversion portions 22 and 23 completely cover the light emission surfaces of the micro LED elements 100. This is because if the bottom surface of the planarization portion 24 overlaps the light emission surfaces of the micro LED elements 100, the light extraction efficiency from the micro LED elements 100 to the transparent portion 21 and the wavelength conversion portions 22 and 23 decreases. The side surfaces of the planarization portion 24 are preferably inclined in order to improve the light extraction efficiency from the transparent portion 21 and the wavelength conversion portions 22 and 23. In a range of 90 degrees or less, the smaller the angle of inclination, the better. However, preferably, the bottom surface of the planarization portion 24 does not overlap the light emission surfaces of the micro LED elements 100 as described above.

Figure 5D:
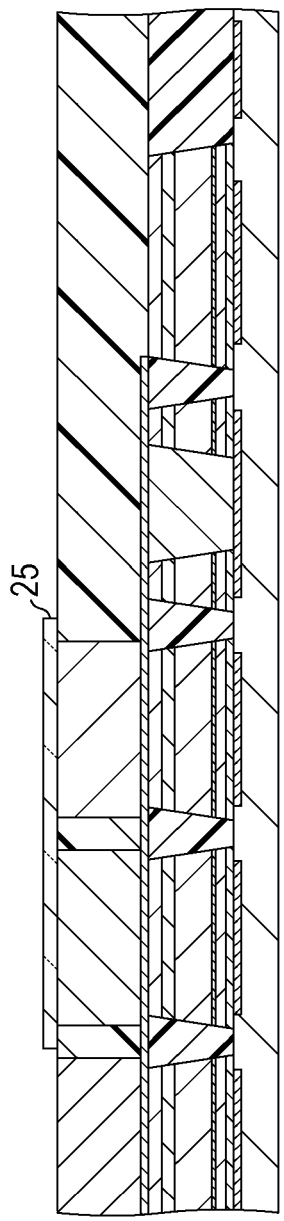
Figure 24:
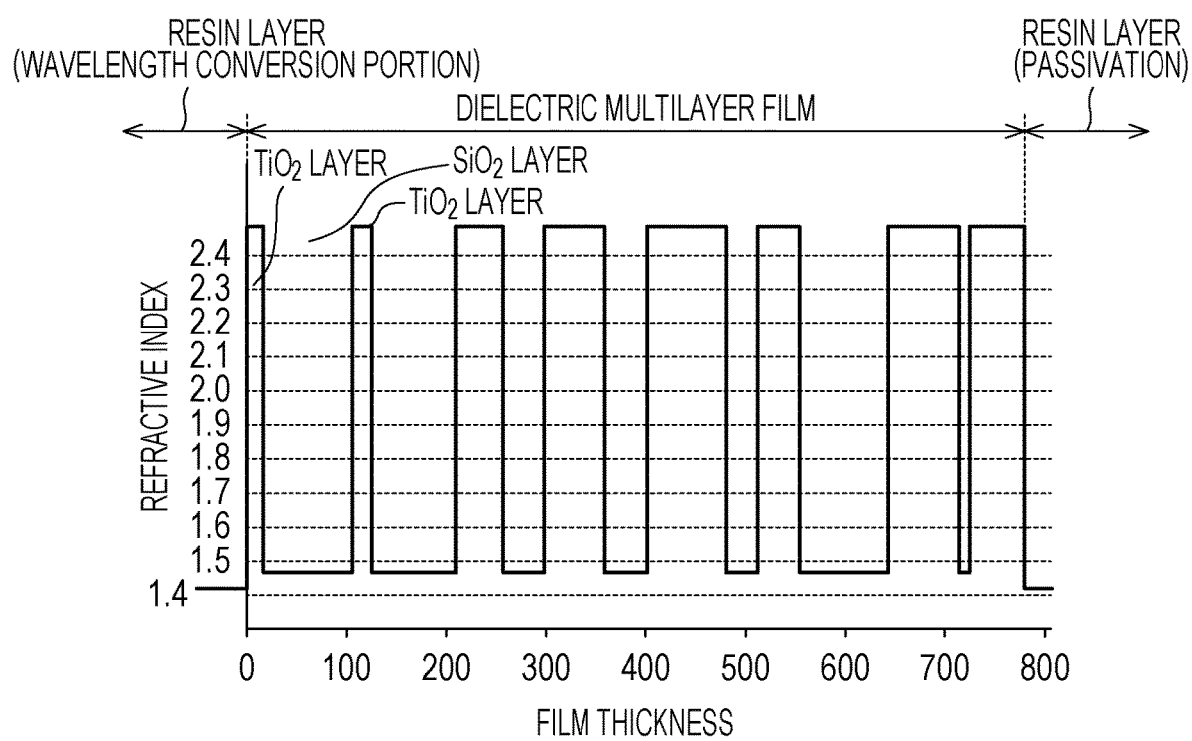
FIG. 24 is a schematic view illustrating the structure of a dielectric multilayer film constituting a transmission layer.

Furthermore, as illustrated in FIG. 5D, a transmission layer 25 is formed. The transmission layer 25 is formed by depositing a dielectric multilayer film, and the dielectric multilayer film is left only on the red sub-pixel 7 and the green sub-pixel 8 and removed from regions other than these sub-pixels. The dielectric multilayer film can be processed by patterning with a typical lithography technique. As illustrated in FIG. 24, the dielectric multilayer film is, for example, a film in which eight titanium oxide ($TiO_2$) layers from 16 nm to 78 nm and seven silicon oxide ($SiO_2$) layers from 11 nm to 90 nm are alternately deposited and has a total film thickness of 780 nm. For blue light (around 460 nm), the transmission layer 25 has a high reflectance of 90% or more at an angle of incidence of 20 degrees or less. In contrast, for green light and red light, the transmission layer 25 has a reflectance of 5% or less and has a high transmittance. Prior to the formation of the transmission layer 25, a transparent resin layer may be formed in order to planarize the surface.

Figures 6A, 6B:
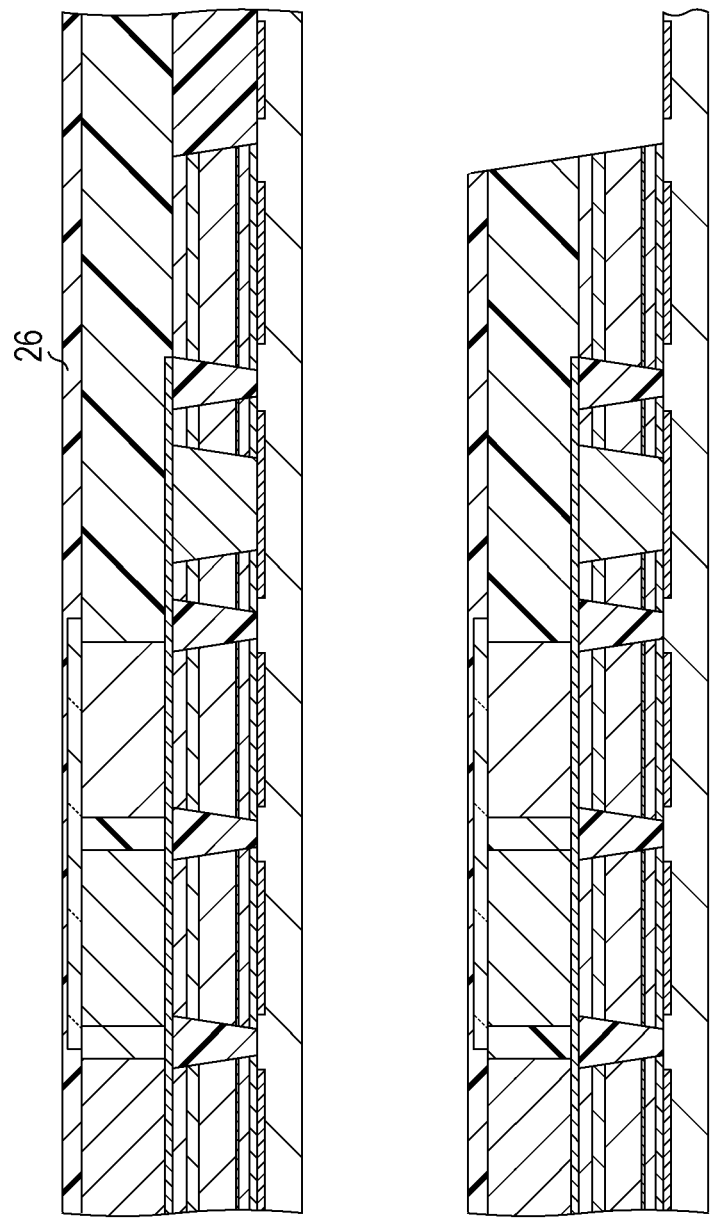
FIGS. 6A and 6B illustrate a process for producing a display device according to the first embodiment of the present disclosure (Part 4)

As illustrated in FIG. 6A, a passivation film 26 is deposited on the transmission layer 25. The passivation film 26 is preferably provided as a protective film because the quality of the transmission layer 25 tends to change due to, for example, moisture absorption. The passivation film is, for example, a silicon nitride film formed by a plasma CVD method or the like or a silicone resin.

Subsequently, the passivation film 26, the planarization portion 24, and the filling material 20 in the peripheral region 4 are removed, and an I/O-electrode 54 is exposed at the surface. Lastly, image display devices 200 formed on the drive circuit substrate 50 are individually cut and each mounted in a package.

When the common electrode 56, the green wavelength conversion portion 23, the red wavelength conversion portion 22, and the transparent portion 21 are formed, the surface of the image display device 200 is preferably flat over the entire surface as illustrated in FIG. 4C. Since a resin layer is applied in many cases, unless the surface is flat, there may be problems in that non-uniformity such as striation is generated during the application and that a uniform wavelength conversion layer cannot be formed. In the case where the nitride semiconductor layer 14 is not provided in the dummy region 3, a difference in height of several micrometers, which corresponds to the thickness of the nitride semiconductor layer 14, is generated, and thus such flatness is not ensured, resulting in a serious problem. Accordingly, the nitride semiconductor layer 14 in the dummy region 3 is necessary, and the dummy-drive electrode 53 for fixing the nitride semiconductor layer 14 is also necessary.

Furthermore, when the transmission layer 25 is formed, the flatness is similarly required, and the planarization portion 24 is preferably provided. The step of exposing the peripheral region including the I/O-electrode 54 is preferably performed after the formation of the common electrode 56, the green wavelength conversion portion 23, the red wavelength conversion portion 22, the transparent portion 21, and the transmission layer 25.

Effects of Reflection Layer and Transmission Layer

The green wavelength conversion portion 23 and the red wavelength conversion portion 22 are each formed by using quantum dots as wavelength conversion particles, dispersing the quantum dots in a negative resist, and patterning the resist by a photolithography technique. The film thickness of each of the portions after patterning was 8 μm. The amounts of quantum dots dispersed were each adjusted such that the transmission intensity of blue light (peak wavelength: 450 nm, peak half-width: 17 nm) serving as excitation light was 1%. The peak wavelength of light emitted from the green wavelength conversion portion 23 is 530 nm and the half-width of the peak is 30 nm. The peak wavelength of light emitted from the red wavelength conversion portion 22 is 630 nm and the half-width of the peak is 32 nm.

The dielectric multilayer film constituting the transmission layer 25 is formed by stacking seven pairs of a $TiO_2$ thin film (thickness: 35.8 nm) and a $SiO_2$ thin film (thickness: 76.8 nm) by an ion-beam vapor deposition method. After the stacking, a resist pattern was left only in portions of the red sub-pixel 7 and the green sub-pixel 8 by a photolithography technique, and a portion of the dielectric multilayer film, the portion being other than the portions of the red sub-pixel 7 and the green sub-pixel 8, was removed by a dry etching technique to form the transmission layer 25. A silicone resin was used as the passivation film 26. When the transmission layer 25 is not provided in the portions of the red sub-pixel 7 and the green sub-pixel 8, the green wavelength conversion portion 23 and the red wavelength conversion portion 22 need to have a thickness of 8 µm in order that the amount of leakage of blue light (amount of energy) in the red sub-pixel 7 and the green sub-pixel 8 is $\frac{1}{100}$ relative to red light and green light, respectively. In contrast, when the transmission layer 25 is provided, the film thickness of the green wavelength conversion portion 23 and the red wavelength conversion portion 22 could be reduced to 4.2 µm and 4.0 µm, respectively. Accordingly, the thickness of each of the wavelength conversion portions could be reduced to about half by the transmission layer 25. This enables the aspect ratio of each of the wavelength conversion portions to be significantly reduced, and thus miniaturization of the pixels can be easily realized.

Meanwhile, by providing the reflection layer 10 in the nitride semiconductor layer 14, the amount of red light emitted from the red sub-pixel 7 was improved by about 8% compared with the case where the reflection layer 10 was not provided. The reason for this is as follows. In the case where the reflection layer 10 is not provided, about half of red light generated in the red wavelength conversion portion 22 travels to the micro LED 100 side, is lastly reflected inside the micro LED 100, and returns from the micro LED 100 to the red wavelength conversion portion 22. However, a large loss is generated because the reflectance of the reflection is low. In contrast, a larger amount of red light is returned from the micro LED 100 to the red wavelength conversion portion 22 by the reflection layer 10 to enhance the red-light extraction efficiency. Presumably, the amount of light emission can be further improved by further improving the reflectance of the reflection layer 10.

Regarding green light, the amount of light emission was improved by about 10% compared with the case where the reflection layer 10 was not provided. The mechanism of the improvement is the same as that in the case of red. The factor of the difference in degree of the improvement is considered to be one or both of the following. (1) Since the reflectance of green light at the P-side layer 13/P-electrode 19P interface is lower than that of red light, the improvement effect seems to be higher. (2) Regarding characteristics of the reflection layer 10, the reflectance to green light became higher than the reflectance to red light.

As described above, the thicknesses of the green wavelength conversion portion 23 and the red wavelength conversion portion 22 can be reduced and light emission efficiencies can be improved by providing the transmission layer 25 on the green wavelength conversion portion 23 and the red wavelength conversion portion 22 (light emission side) and providing the reflection layer 10 under the green wavelength conversion portion 23 and the red wavelength conversion portion 22 (excitation light source side). Miniaturization is facilitated, and the amounts of expensive wavelength conversion materials used are reduced. Thus, an effect of reducing the production cost is also achieved.

Second Embodiment

The present embodiment differs from the first embodiment in that the transmission layer 25 is not provided. Other configurations of the present embodiment are the same as those of the first embodiment.

The transmission layer 25 can be omitted when the micro LEDs 100 each have a relatively large size, and the thicknesses of the green wavelength conversion portion 23 and the red wavelength conversion portion 22 can be made large enough to prevent blue light from leaking. This is because an increase in the number of steps is thereby suppressed and equipment such as an apparatus for forming a dielectric multilayer film can be reduced. Even when the transmission layer 25 is omitted, the effect of improving the light extraction, the effect being achieved by the reflection layer 10, is useful. In addition, once the formation of the reflection layer 10 is incorporated in the step of forming the nitride semiconductor layer 14, an increase in the cost due to the reflection layer 10 is slight.

Figure 7A:
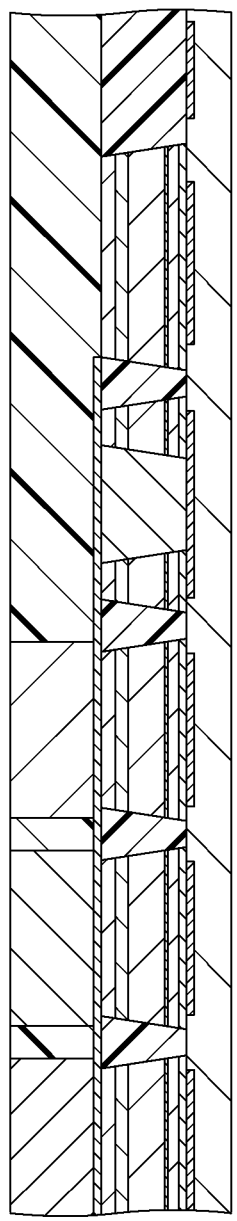
FIGS. 7A and 7B are each a sectional view of a display device according to a second embodiment of the present disclosure.
Figure 7B:
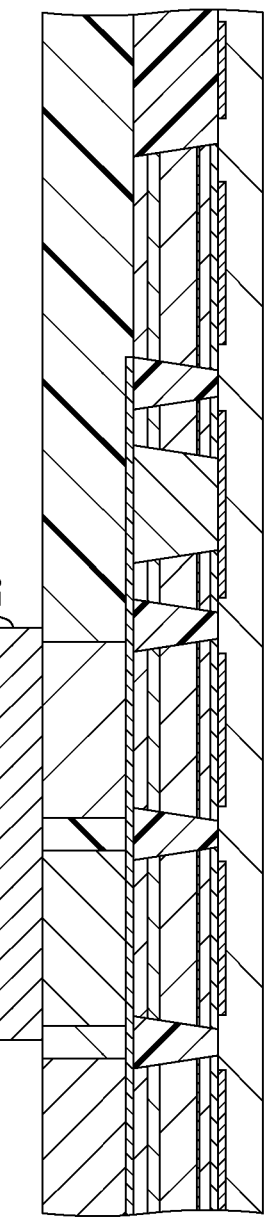

An image display device 200a in FIG. 7A can be produced through the steps up to FIG. 5C. The passivation film 26 may be added to this structure. An image display device 200b in FIG. 7B has a structure in which a blue-light absorbing filter (filter layer that absorbs excitation light) 29 that absorbs blue light is further provided on a red sub-pixel 7 and a green sub-pixel 8 of the image display device 200a. When the output of the micro LEDs 100 has surplus power, the output of the micro LEDs 100 may be increased in some cases in order to obtain desired red light/green light. In such a case, blue light which is excitation light leaking from the green wavelength conversion portion 23 and the red wavelength conversion portion 22 is absorbed by the blue-light absorbing filter 29 to thereby prevent color purities of the red light/green light from decreasing. According to the present embodiment, the light output can be improved in the image display device 200a and the image display device 200b while an increase in the cost is reduced to the minimum.

Third Embodiment

The present embodiment differs from the second embodiment in that none of the green wavelength conversion portion 23, the red wavelength conversion portion 22, and the transparent portion 21 is provided, a yellow wavelength conversion portion 30 is provided over the pixels, and color filters of blue, green, and red are provided. Other configurations of the present embodiment are the same as those of the second embodiment.

Figure 8:
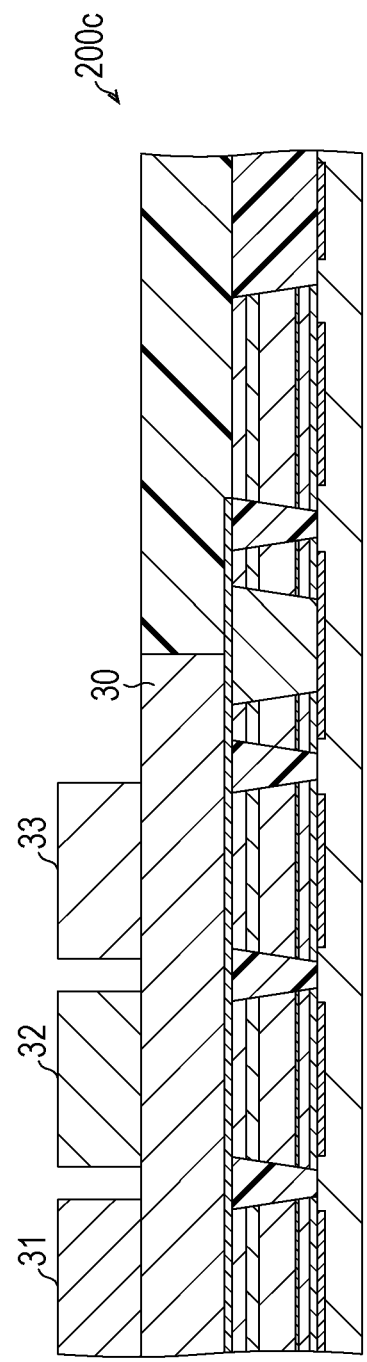
FIG. 8 is a sectional view of a display device according to a third embodiment of the present disclosure.

As illustrated in an image display device 200c in FIG. 8, a yellow wavelength conversion portion 30 is formed over the pixel region 1. The yellow wavelength conversion portion 30 is excited by blue light and emits yellow light, and white light is emitted as a whole. A blue color filter 31, a red color filter 32, and a green color filter 33 are disposed on a blue sub-pixel 6, a red sub-pixel 7, and a green sub-pixel 8, respectively, and the blue sub-pixel 6, the red sub-pixel 7, and the green sub-pixel 8 emit blue light, red light, and green light, respectively. That is, the red color filter 32 transmits only red light and does not transmit blue light (excitation light) and green light (part of long-wavelength light). The green color filter 33 transmits only green light and does not transmit blue light (excitation light) and red light (part of long-wavelength light). The blue color filter 31 transmits blue light and does not transmit red light and green light (long-wavelength light). In FIG. 8, the blue color filter 31, the red color filter 32, and the green color filter 33 are disposed to be separated from each other, but may be disposed to be in close contact with each other. The yellow wavelength conversion portion 30 is disposed to extend over a plurality of pixels. Alternatively, the yellow wavelength conversion portion 30 may be divided by the planarization portion 24 for each sib-pixel, as illustrated in FIG. 1.

YAG phosphor fine particles can be used in the yellow wavelength conversion portion 30. YAG phosphors have higher stability than quantum dots and can be used at relatively high temperatures. Accordingly, the image display device 200c can be operated at higher power than devices that use quantum dots or other phosphor materials. Thus, this configuration is useful when a high light output is required.

The process for producing this configuration is very simple because the yellow wavelength conversion portion 30 is merely formed as the wavelength conversion portion. The wavelength conversion portion need not be processed for each pixel, and a commonly used color filter technology can be employed. Thus, the production process is easily performed in terms of technology. Meanwhile, the effect of improving the light extraction, the effect being achieved by the reflection layer 10, is useful. In addition, once the formation of the reflection layer 10 is incorporated in the step of forming the nitride semiconductor layer 14, an increase in the cost due to the reflection layer 10 is slight.

According to the present embodiment, the light output can be improved in the image display device 200c while an increase in the cost is reduced to the minimum.

Fourth Embodiment

The present embodiment differs from the first embodiment in the method for producing the transmission layer 25. Other configurations of the present embodiment are the same as those of the first embodiment.

In the first embodiment, after the formation of the wavelength conversion portions, the transmission layer 25 is formed on the wavelength conversion portions. Accordingly, since the dielectric multilayer film constituting the transmission layer 25 is formed on a resin layer, there is an upper limit to the formation temperature, and stability of the dielectric multilayer film is limited. In order to form a more stable transmission layer 25, a transmission layer 25f is obtained by forming a dielectric multilayer film over the entire surface of a transparent substrate 34, and removing a portion of the dielectric multilayer film located in a portion corresponding to a blue sub-pixel 6. As illustrated in FIG. 9A, the transparent substrate 34 and the transmission layer 25f obtained as described above are bonded to the drive circuit substrate 50 prepared in the step in FIG. 5C. Thus, an image display device 200d illustrated in FIG. 9B is formed. A transparent adhesive may be used in the bonding. As the transparent substrate, quartz, sapphire, heat-resistant glass, or the like can be used, and the transmission layer 25f can be formed at a high temperature. Therefore, a more stable member is obtained.

This configuration also achieves the same effects as those in the first embodiment. Furthermore, the transmission layer 25f is formed at a high temperature and thus has durability. Since the pixel region 1 of the image display device 200d is sealed with the transparent substrate 34, durability can be improved.

Fifth Embodiment

The present embodiment differs from the first embodiment in the configuration of the reflection layer 10. Other configurations of the present embodiment are the same as those of the first embodiment.

Figure 10:
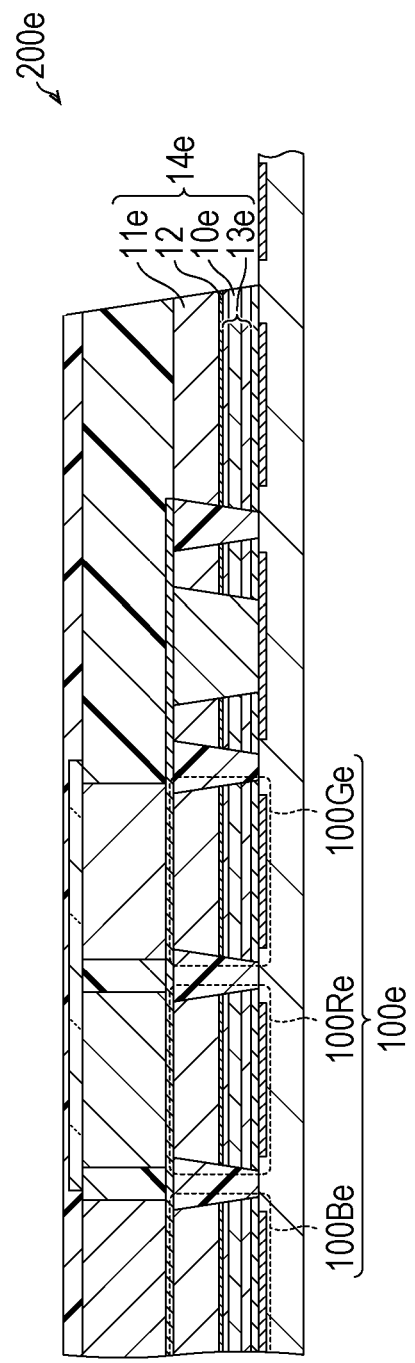
FIG. 10 is a sectional view of a display device according to a fifth embodiment of the present disclosure.

The present embodiment differs from the first embodiment in that the reflection layer 10 is provided in the N-side layer 11 in the first embodiment whereas a reflection layer is provided in a P-side layer 13 in micro LED elements 100e (collectively referring to a micro LED element B 100Be, a micro LED element R 100Re, and a micro LED element G 100Ge) illustrated in FIG. 10. Even when a reflection layer 10e is disposed in the P-side layer 13, reflection properties for green light and red light generated in the green wavelength conversion portion 23 and the red wavelength conversion portion 22, respectively, do not significantly change. This is because the light emission layer 12 hardly absorbs green light and red light. The reflection layer 10e is disposed in the P-side layer 13 and thus has P-type conductivity. In the present embodiment, the reflection layer 10e is included inside the nitride semiconductor layer 14e and disposed on the drive circuit substrate 50 side with respect to the light emission layer 12. The reflection layer 10e is also divided by the pixel isolation trenches 15 for each micro LED element 100e, and therefore it is effective in reducing the light crosstalk.

Furthermore, the light output can be improved by adding a high reflectance for blue light (excitation light) in addition to red light/green light (long-wavelength light) in the reflection layer 10e.

As described above, in an image display device 200e, the reflection layer 10e is disposed on the drive circuit substrate 50 side with respect to the light emission layer 12 in a nitride semiconductor layer 14e that forms the micro LED elements 100e and also reflects blue light (excitation light).

The reflection layer 10e has high reflection properties at least in the green region (for example, wavelength: 520 nm±15 nm), the red region (for example, wavelength: 630 nm±15 nm), and the blue region (for example, wavelength: 460 nm±15 nm). This is because since a high reflectance for blue light which is excitation light can also be realized on the P-side layer 13 side, the light output of the micro LED element B 100Be, the micro LED element R 100Re, and the micro LED element G 100Ge can be improved. Accordingly, the light output of a blue sub-pixel 6 improves, the light output of a red sub-pixel 7 and a green sub-pixel 8 also improves, and the light emission efficiency of the entire image display device 200e can be improved.

According to the present embodiment, the light output can be improved in the image display device 200e.

Sixth Embodiment

The present embodiment differs from the first embodiment in micro LED elements 100f. Other configurations of the present embodiment are the same as those of the first embodiment. The micro LED elements 100 of the first embodiment are so-called upper/lower electrode-type elements that include the P-electrode 19P on the drive circuit substrate 50 side and the common N-electrode 56 on the light emission side. The micro LED elements 100f of the present embodiment has a configuration in which a P-electrode and an N-electrode are each disposed on one side.

Figure 11:
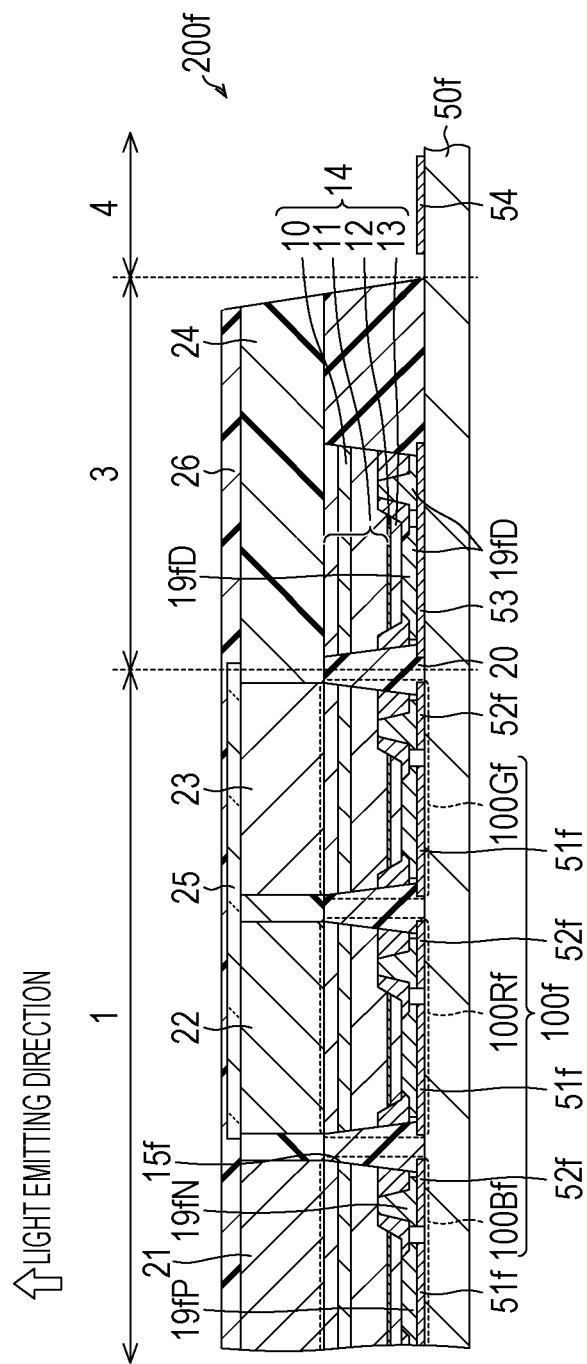
FIG. 11 is a sectional view of a display device according to a sixth embodiment of the present disclosure.

As illustrated in FIG. 11, micro LED elements 100f (collectively referring to a micro LED element B 100Bf, a micro LED element R 100Rf, and a micro LED element G 100Gf) each have a P-electrode 19fP and an N-electrode 19fN on the drive circuit substrate 50f side. The drive circuit substrate 50f has a P-drive electrode 51f and an N-drive electrode 52f for each sub-pixel thereon, and the P-drive electrode 51f and the N-drive electrode 52f are connected to the P-electrode 19fP and the N-electrode 19fN, respectively. The drive circuit substrate 50f supplies a predetermined current to the micro LED elements 100f and controls light emission. This configuration is advantageous in that the step of producing the common N-electrode 56 can be omitted in the process of producing an image display device 200f, and the image display device 200f can be easily produced. On the other hand, both the P-electrode and the N-electrode need to be disposed on one side of the micro LED elements 100f, it is more difficult to miniaturize the elements. This configuration is suitable for use in a head-up display or a projector that requires high power. In the present embodiment, the reflection layer 10 is included inside the nitride semiconductor layer 14 and disposed on the wavelength conversion layer side with respect to the light emission layer 12. Although the reflection layer 10 is formed of a nitride semiconductor, it is not necessary to allow a current to flow in the up-down direction as in the first embodiment, and the reflection layer 10 may have a higher resistivity than a portion of the N-side layer 11 (resistivity: 1.0 to 10 mΩcm) other than the reflection layer 10. The high resistivity of the reflection layer 10 enables crystallinity of the nitride semiconductor layer 14 to be improved and enables the light output of the micro LED elements 100f to be improved. In FIG. 11, the N-electrode 19fN is provided for each sub-pixel. However, the N-electrode 19fN need not be provided for each of the micro LED elements 100f, and a plurality of micro LED elements 100f may share a single N-electrode 19fN.

From the viewpoint of the image display device 200f, the effects achieved by the reflection layer 10 and the transmission layer 25 are the same as those in the first embodiment although the arrangement of the electrodes of the micro LED elements 100f is different. The thicknesses of the green wavelength conversion portion 23 and the red wavelength conversion portion 22 can be reduced, and the light emission efficiency can be improved by providing the transmission layer 25 on the green wavelength conversion portion 23 and the red wavelength conversion portion 22 (on the light emission side) and providing the reflection layer 10 under the green wavelength conversion portion 23 and the red wavelength conversion portion 22 (on the excitation light source side). Miniaturization is facilitated, and the amounts of expensive wavelength conversion materials used are reduced. Thus, an effect of reducing the production cost is also achieved.

Production Method

Next, an example of a method for producing micro LED elements 100f will be described with reference to FIGS. 12A to 14C. Descriptions regarding the same steps as those in FIGS. 3A to 6B will be omitted. The significant difference from FIGS. 3A to 6B lies in that, besides the arrangement of the electrodes, the production method includes forming micro LED elements 100f on a growth substrate 9f, cutting the resulting growth substrate 9f into individual pieces in units of image display devices 200f, and subsequently bonding the devided unit of the LED elements 100f onto a drive circuit substrate 50f in units of pieces.

Figure 12A:
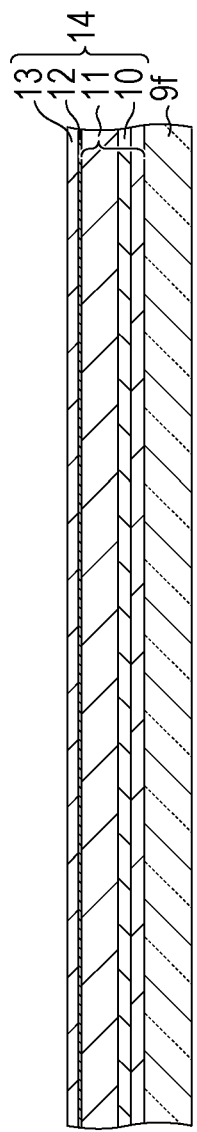
FIGS. 12A to 12E illustrate a process for producing a display device according to the sixth embodiment of the present disclosure (Part 1)

The present embodiment is the same as the first embodiment in that a nitride semiconductor layer 14 including a reflection layer 10 is formed on a growth substrate 9f as illustrated in FIG. 12A. However, for example, a (0001) plane sapphire substrate can be used as the growth substrate 9f in the present embodiment.

Figure 12B:
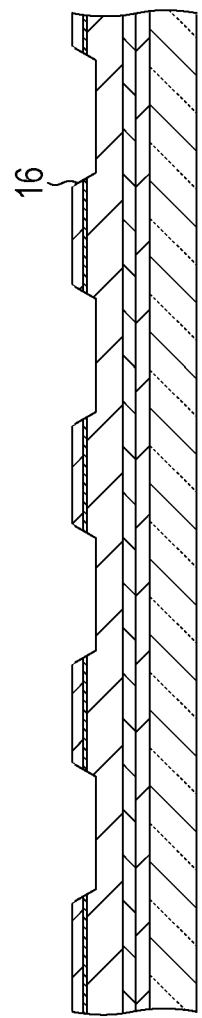
Figure 12C:
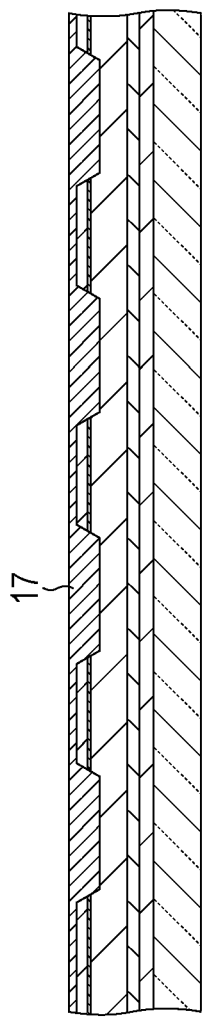
Figure 12D:
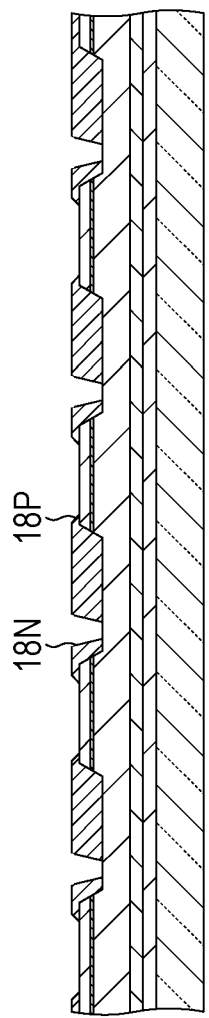
Figure 12E:
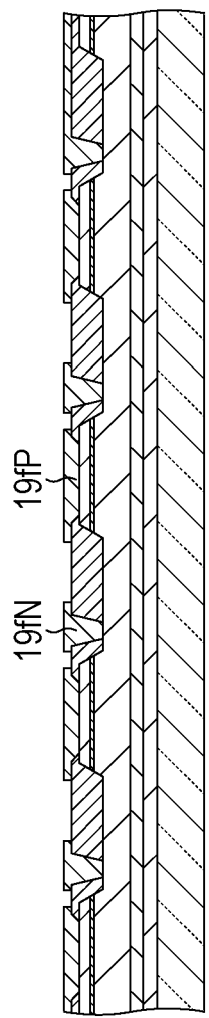
Figure 14A:
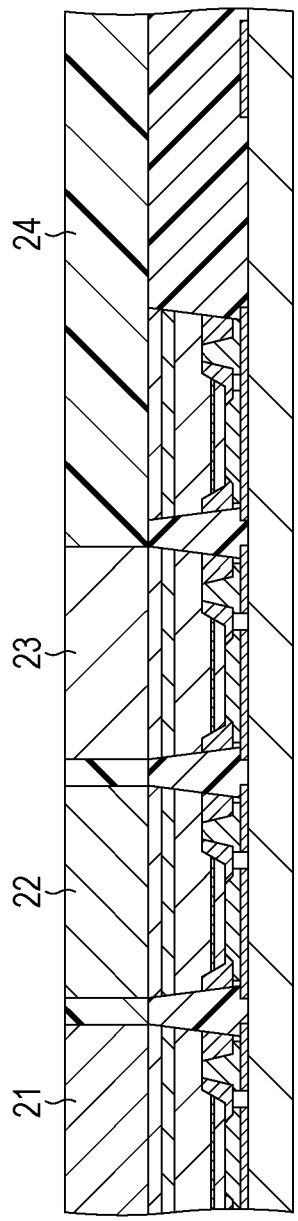
FIGS. 14A to 14C illustrate a process for producing a display device according to the sixth embodiment of the present disclosure (Part 3)
Figure 14B:
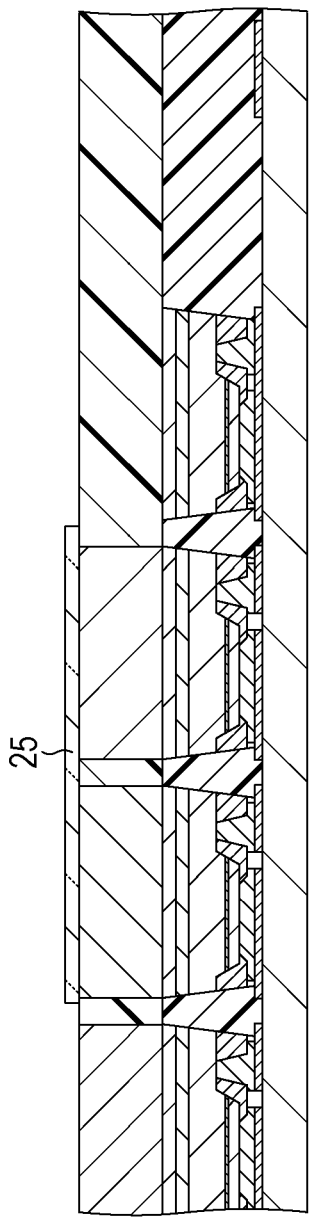
Figure 14C:
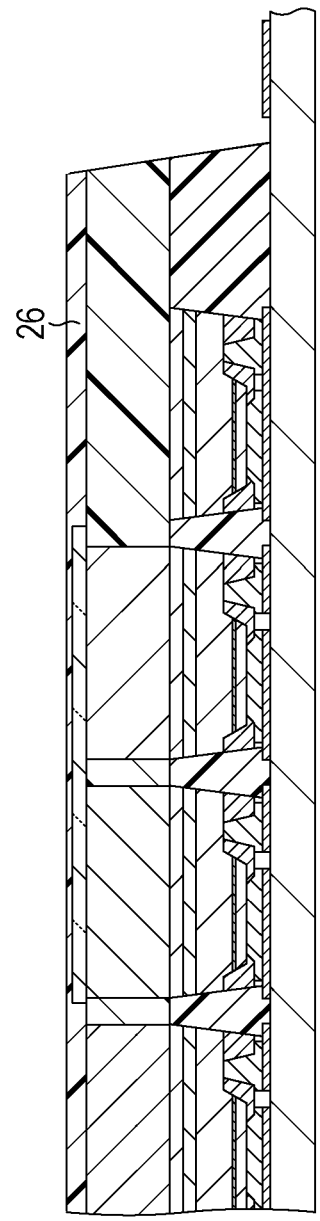

As illustrated in FIG. 12B, portions of a P-side layer 13, a light emission layer 12, and an N-side layer 11 are etched to form a mesa 16, and the resulting surface is then covered with a protective film 17 as illustrated in FIG. 12C. The protective film 17 is formed of, for example, silicon dioxide (SiO₂). Subsequently, as illustrated in FIG. 12D, a P-side contact hole 18P is formed on the P-side layer 13 in a top portion of the mesa 16, and an N-side contact hole 18N is formed in an exposed portion of the N-side layer 11 in the bottom portion of the mesa 16. A P-electrode 19fP and an N-electrode 19fN are formed in the P-side contact hole 18P and the N-side contact hole 18N, respectively, as illustrated in FIG. 12E. Subsequently, as illustrated in FIG. 13A, the protective film 17 and the nitride semiconductor layer 14 are etched to form a pixel isolation trench 15f and to separate micro LED elements 100f from each other. The reflection layer 10 is also divided by the pixel isolation trenches 15f for each micro LED element 100f.

In the present configuration, since the processing is performed from the light emission layer 12 side by a dry etching technique, as illustrated in FIGS. 12C and 13A, it is easy to cover the light emission layer 12 with the inclined side surfaces of the mesa 16 and to incline the side surfaces of the N-side layer 11 of the micro LED elements 100f. Each of the side surfaces is inclined to be open with respect to the light emission direction. Thus, the light extraction efficiency of the micro LED elements 100f can be enhanced. Furthermore, by covering the sidewalls of the pixel isolation trench 15 with a highly reflective metal film, leakage of light from the side surfaces of the micro LED elements 100f is prevented, and the light extraction efficiency in the light emission direction can be enhanced. By disposing a transparent insulating film between the side surface of the N-side layer 11 and the metal film, the light extraction efficiency of the micro LED elements 100f can be further enhanced.

Although not shown in the figure, the growth substrate 9f on which the micro LED elements 100f are formed is polished, cut in units of image display devices 200f, and divided into pieces. The growth substrate 9f is bonded onto a drive circuit substrate 50f in the state of a divided piece, as illustrated in FIG. 13B. The drive circuit substrate 50f may be in a wafer state or in a state of a chip divided in units of image display devices 200f. Hereinafter, a description will be made of a case in a wafer state.

Subsequently, the growth substrate 9f is separated as illustrated in FIG. 13C. Desirably, the bonding state in FIG. 13B is temporary adhesion, and the actual connection is formed after the separation of the growth substrate 9f in FIG. 13C. The reason for this is as follows. In the case where thermal expansion is different between the growth substrate 9f and the drive circuit substrate 50f, it is difficult to perform a process accompanying a significant increase in temperature in a state where the growth substrate 9f is present. Therefore, the actual connection accompanying an increase in temperature is preferably formed after the separation of the growth substrate 9f. In this configuration, each of the micro LED elements 100f can emit light in the temporary adhesion state or the actual connection state under control of the drive circuit substrate 50f. Accordingly, characteristics of the respective micro LED elements 100f can be tested. Therefore, in the case where a defective micro LED element 100f is found, the repair can be performed by removing the defective micro LED element 100f and bonding a normal product. The present embodiment is also advantageous in that such repair can be easily performed because electrical connection of the micro LED elements 100f is present only on the drive circuit substrate 50f side.

The subsequent steps are illustrated in FIGS. 13D to 14C. FIG. 13D illustrates a step of forming a filling material 20 as in FIG. 4A, and FIGS. 14A to 14C illustrate the same steps as those in FIGS. 4E to 6B. Accordingly, descriptions of these steps are omitted.

Seventh Embodiment

The present embodiment differs from the sixth embodiment in micro LED elements 100g. Other configurations of the present embodiment are the same as those of the sixth embodiment. In the micro LED elements 100f of the sixth embodiment, the reflection layer 10 is formed of a nitride semiconductor layer. In micro LED elements 100g of the present embodiment, a dielectric multilayer film is used as a reflection layer 10g. Therefore, a method for growing a nitride semiconductor layer 14g is changed, however, points other than the reflection layer 10g are the same as those in the sixth embodiment.

Figure 15:
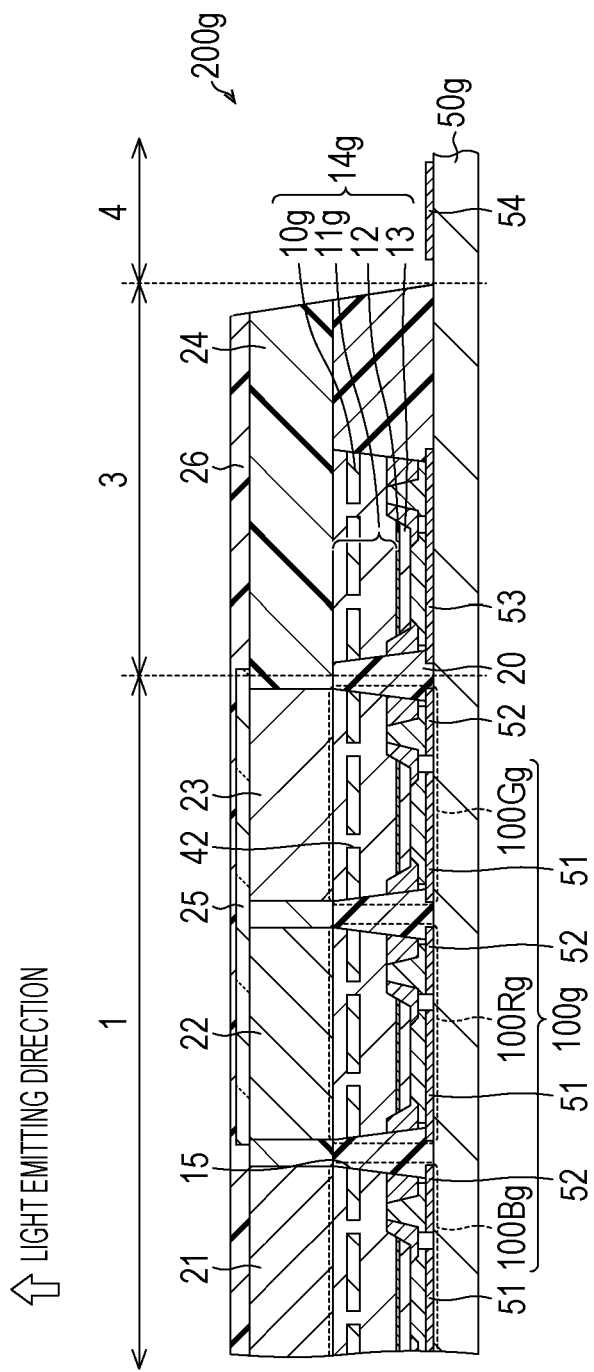
FIG. 15 is a sectional view of a display device according to a seventh embodiment of the present disclosure.

FIG. 15 is a schematic sectional view of an image display device 200g of the present embodiment. The image display device 200g differs from the image display device 200f in that micro LED elements 100g have a reflection layer 10g formed of a dielectric multilayer film, and that the reflection layer log has through portions 42 in part thereof. In the present embodiment, the reflection layer 10g is included inside the nitride semiconductor layer 14g and disposed on the wavelength conversion layer side with respect to the light emission layer 12.

As illustrated in FIG. 15, in the image display device 200g, the reflection layer 10g is a dielectric multilayer film, the nitride semiconductor layer 14g that forms the micro LED elements 100g has the through portions 42 in part of the reflection layer 10g, and the through portions 42 are provided for each of the micro LED elements 100g. The through portions 42 are filled with a nitride semiconductor such as GaN. In this configuration, since a current does not need to be supplied to the through portions 42, the nitride semiconductor in the through portions 42 may have a higher resistivity than other portions of the N-side layer 11g.

According to the configuration described above, since the through portions 42 are provided for each of the micro LED elements 100g, variations in characteristics among the micro LED elements 100g are reduced, and the reflectance of the reflection layer 10g is improved by using the dielectric multilayer film and thus the light output can be improved.

Figure 16A:
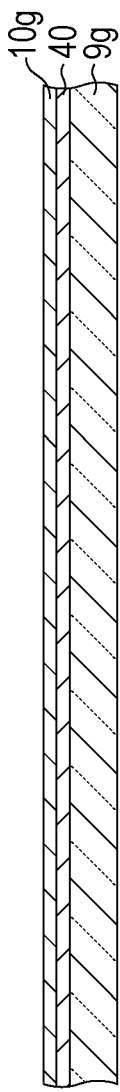
FIGS. 16A to 16D illustrate a process for producing a display device according to the seventh embodiment of the present disclosure.

FIGS. 16A to 16D illustrates steps of forming a nitride semiconductor layer 14g that forms micro LED elements 100g. As illustrated in FIG. 16A, a seed layer 40 is formed on a growth substrate 9g, and a dielectric multilayer film is formed on the seed layer 40. The seed layer 40 is, for example, a GaN layer. The seed layer 40 can be omitted in some cases depending on the type of the growth substrate 9g.

The dielectric multilayer film must be a film that is stable at a high temperature. For example, a combination of silicon dioxide ($SiO_2$) and a silicon nitride film ($Si_3N_4$) formed by a CVD method is preferred. The dielectric multilayer film can be formed by stacking a plurality of pairs of a $SiO_2$ layer and a $Si_3N_4$ layer. For example, six pairs of a $SiO_2$ layer having a thickness of 89 nm and a $Si_3N_4$ layer having a thickness of 65 nm, the pairs each having a total thickness of 154 nm, are deposited, and six pairs of a $SiO_2$ layer having a thickness of 108 nm and a $Si_3N_4$ layer having a thickness of 79 nm, the pairs each having a total thickness of 187 nm, are formed thereon. The total number of the pairs is 12, and the reflection layer 10g has a total film thickness of about 2 μm. With this structure, a reflectance of 80% can be ensured at a wavelength of 520 nm and a wavelength of 630 nm.

Figure 16B:
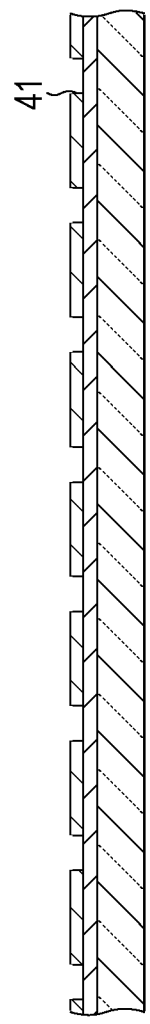

Next, as illustrated in FIG. 16B, openings 41 are formed in the reflection layer 10g to expose the seed layer 40 at bottom portions thereof. The openings can be formed by a typical photolithography technique and a typical dry etching technique. The arrangement period of the openings 41 is preferably at least the same as the arrangement period of pixels or a reciprocal of an integer multiple of the arrangement period of pixels. This is a condition necessary for arranging the same number of openings 41 for each of the micro LED elements 100g. Although the area of the openings 41 is smaller than the entire area and the optical influence of the openings 41 is not large, the effect of the reflection layer 10g is weakened with an increase in the number of the openings 41. Accordingly, it is preferable to arrange the openings for each of the micro LED elements 100g in the same manner.

Figure 16C:
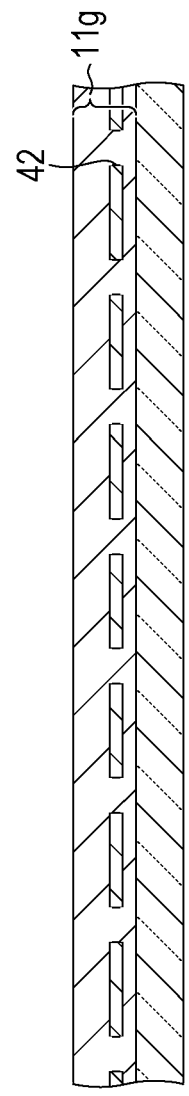

Subsequently, as illustrated in FIG. 16C, an N-side layer 11g is grown. In the initial growth, the openings 41 are first filled with a GaN film by using a selective growth technique of a GaN film. Subsequently, a GaN layer is extended on the reflection layer 10g by growing the GaN film in the lateral direction, the surface is planarized, and the film thickness is increased to form the N-side layer 11g.

Figure 16D:
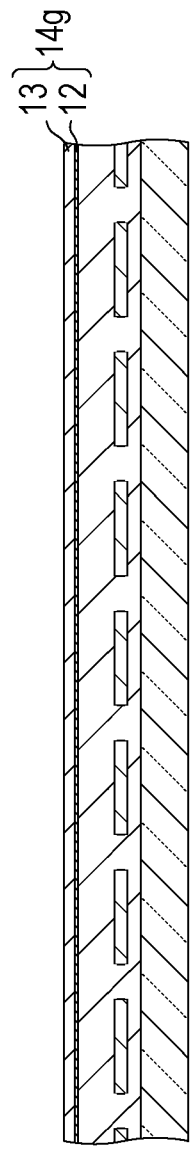

Furthermore, as illustrated in FIG. 16D, a light emission layer 12 and a P-side layer 13 are grown on the N-side layer 11g to form a nitride semiconductor layer 14g. The steps of growing the light emission layer 12 and the P-side layer 13 are the same as those of the sixth embodiment.

The step of forming micro LED elements 100g and the step of producing an image display device 200g after the formation of the nitride semiconductor layer 14g are the same as those of the sixth embodiment.

In this configuration, since the reflection layer 10g is formed by stacking two types of dielectric films having refractive indices that are significantly different from each other, the reflectance of the reflection layer 10g can be improved. Accordingly, the emission efficiency of red light and green light can be further improved. In the present embodiment, the transparent portion 21 and the wavelength conversion portions 22 and 23 each having an upper surface with substantially the same size as the corresponding micro LED element 100g are disposed as illustrated in FIG. 15. Alternatively, a transparent portion 21 and wavelength conversion portions 22 and 23 each having an upper surface with a larger size than the corresponding micro LED element 100g may be disposed as in the first embodiment.

Modification

Figure 17:
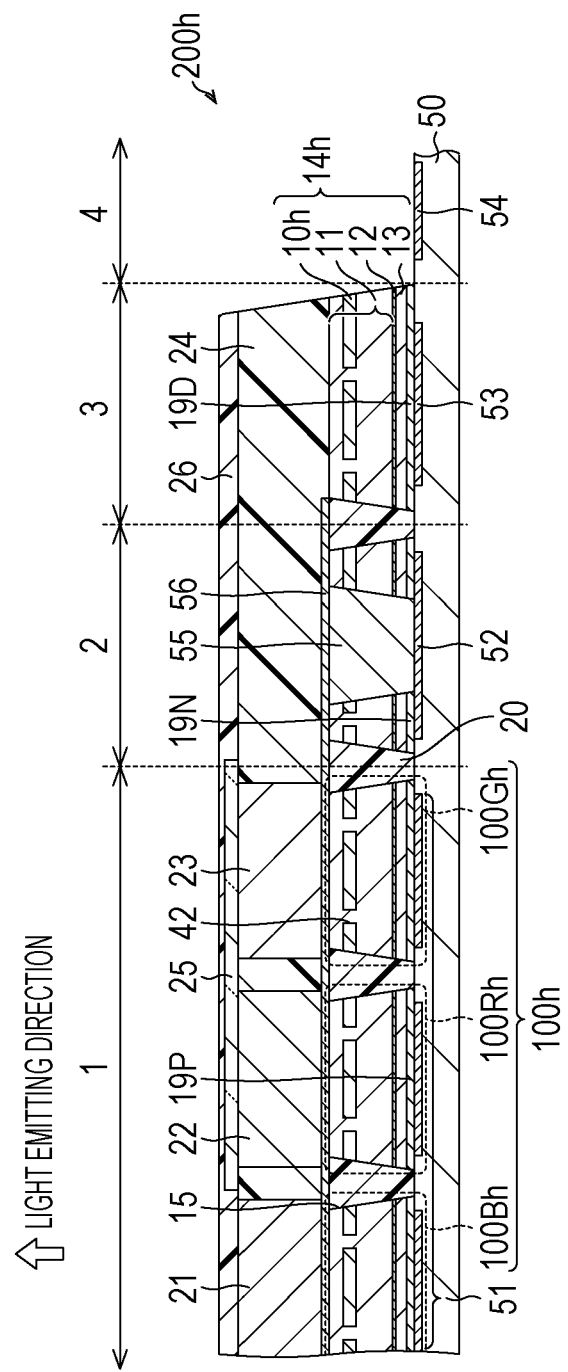
FIG. 17 is a sectional view illustrating a modification of a display device according to the seventh embodiment of the present disclosure.

FIG. 17 illustrates a modification of the seventh embodiment. This modification is an embodiment in which the nitride semiconductor layer 14g described in the seventh embodiment is applied to the micro LED elements 100 of the first embodiment.

As illustrated in FIG. 17, micro LED elements 100h (collectively referring to a micro LED element B 100Bh, a micro LED element R 100Rh, and a micro LED element G 100Gh) have a reflection layer 10h and through portions 42. Other structures are the same as those of the micro LED elements 100 of the first embodiment. In this configuration, it is necessary to cause a current to flow through the through portions 42, and thus the GaN layer constituting the seed layer 40 and the through portions 42 is doped to be N-type and has conductivity. That is, the through portions 42 are filled with a conductive nitride semiconductor.

As described above, for the upper/lower electrode-type micro LED elements 100h, a reflection layer formed of a dielectric multilayer film is similarly disposed in the nitride semiconductor layer 14h, and the light output of the image display device 200h can be improved.

In the present modification, the nitride semiconductor layer 14g of the seventh embodiment is combined with the (upper/lower electrode-type) micro LED elements 100 of the first embodiment. Alternatively, an upper/lower electrode-type micro LED elements can be formed by the production process described in the seventh embodiment. In this case, it is easy to surround the light emission layer 12 by inclined side surfaces and to incline the side surfaces of the N-side layer 11 of the micro light-emitting elements as in the sixth embodiment and the seventh embodiment. By inclining each of the side surfaces to be open with respect to the light emission direction, the light extraction efficiency of the micro light-emitting elements can be enhanced. Furthermore, by covering the sidewalls of the pixel isolation trench 15 with a highly reflective metal film, leakage of light from the side surfaces of the micro light-emitting elements is prevented, and the light extraction efficiency in the light emission direction can be enhanced. By disposing a transparent insulating film between the side surface of the N-side layer 11 and the metal film, the light extraction efficiency of the micro light-emitting elements can be further enhanced.

Eighth Embodiment

The present embodiment differs from the first embodiment in micro LED elements 100i. Other configurations of the present embodiment are the same as those of the first embodiment. The micro LED elements 100 of the first embodiment have, inside the nitride semiconductor layer 14, a reflection layer 10 including a nitride semiconductor. A reflection layer 10i of this configuration is formed of a dielectric multilayer film and disposed outside a P-side layer 13. That is, the reflection layer 10i is disposed on the drive circuit substrate 50 side with respect to the light emission layer 12.

Figure 18:
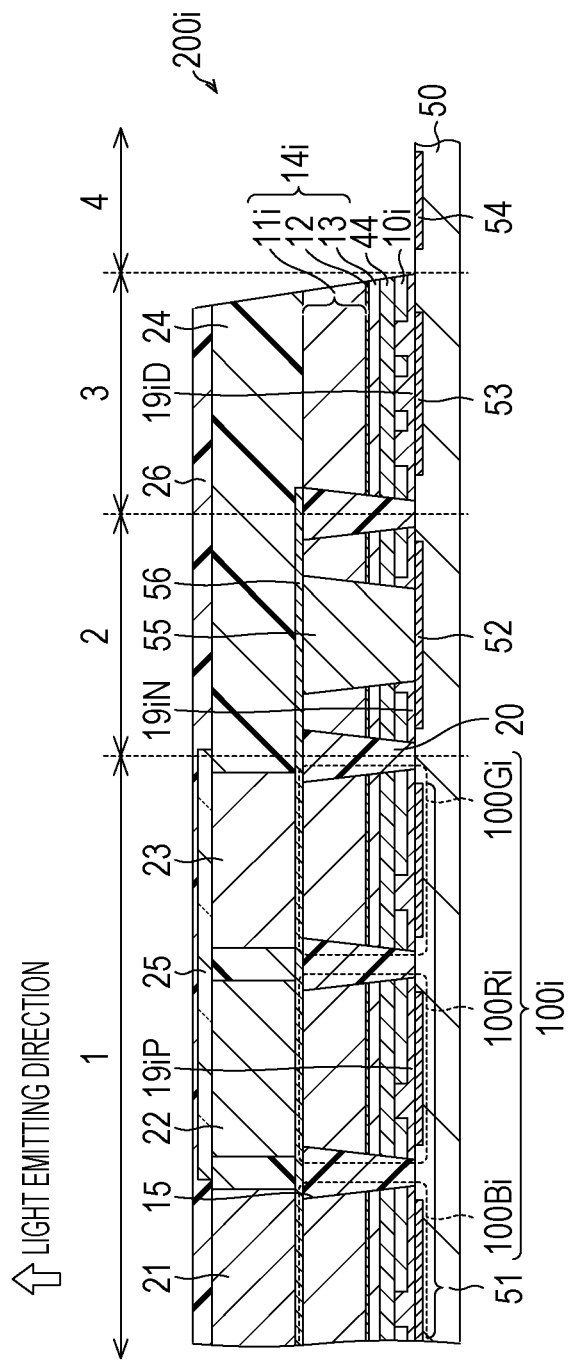
FIG. 18 is a sectional view of a display device according to an eighth embodiment of the present disclosure.

As illustrated in FIG. 18, micro LEDs 100i (collectively referring to a micro LED element B 100Bi, a micro LED element R 100Ri, and a micro LED element G 100Gi) have a transparent electrode layer 44 and a reflection layer 10i on the drive circuit substrate 50 side of a P-side layer 13, and the transparent electrode layer 44 is connected to a P-drive electrode 51 with a P-electrode 19iP therebetween. A nitride semiconductor layer 14i that forms the micro LEDs 100i includes an N-side layer 11i, a light emission layer 12, and the P-side layer 13 and need not include a reflection layer. Other configurations are the same as those of the first embodiment.

In this configuration, a dielectric multilayer film is used as the reflection layer 10i. The reflection layer 10i preferably has a high reflectance for blue light (excitation light) besides red light and green light (long-wavelength light). As a result, the same effect as that in the fifth embodiment can be generated. Specifically, the light output can be improved by adding a high reflectance for blue light in addition to red light/green light in the reflection layer 10i. This is because since a high reflectance for blue light which is excitation light can also be realized on the P-side layer 13 side, the light output of the micro LED element B 100Bi, the micro LED element R 100Ri, and the micro LED element G 100Gi can be improved. Accordingly, the light output of a blue sub-pixel 6 improves, the light output of a red sub-pixel 7 and a green sub-pixel 8 also improves, and the light emission efficiency of the entire image display device 200i can be improved.

Furthermore, in the present embodiment, a multilayer film that is formed at a relatively high temperature, that is stable, and that uses pairs of dielectric films having refractive indices that are significantly different from each other is easily used as the reflection layer 10i, and a reflection layer 10i having high reflectances for blue light, red light, and green light can be formed as a relatively thin layer. Consequently, an increase in the cost due to an improvement in light output characteristics can be reduced to the minimum.

As illustrated in FIG. 18, the reflection layer 10i is a dielectric multilayer film and is disposed on the drive circuit substrate 50 side with respect to the nitride semiconductor layer 14i that forms the micro LED elements 100i, and the drive circuit substrate 50 and the nitride semiconductor layer 14i are connected to each other with an electrode therebetween, the electrode extending through the reflection layer 10i. According to the configuration described above, in the image display device 200i, the drive circuit substrate 50 and the nitride semiconductor layer 14i can be connected to each other with an electrode therebetween, the electrode extending through the reflection layer 10i.

Production Method

Figure 19A:
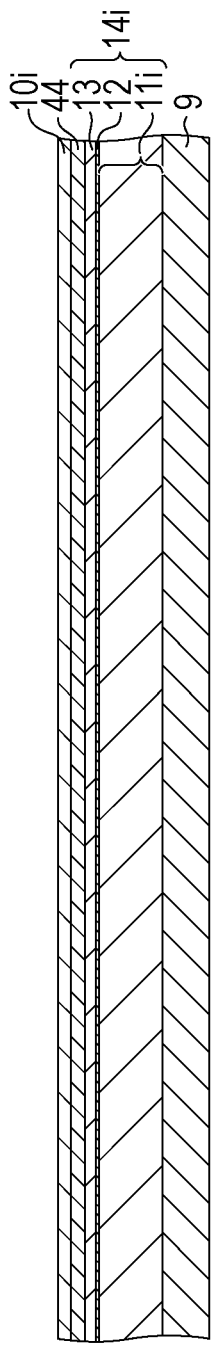
FIGS. 19A to 19E illustrate a process for producing a display device according to the eighth embodiment of the present disclosure (Part 1)
Figure 23:
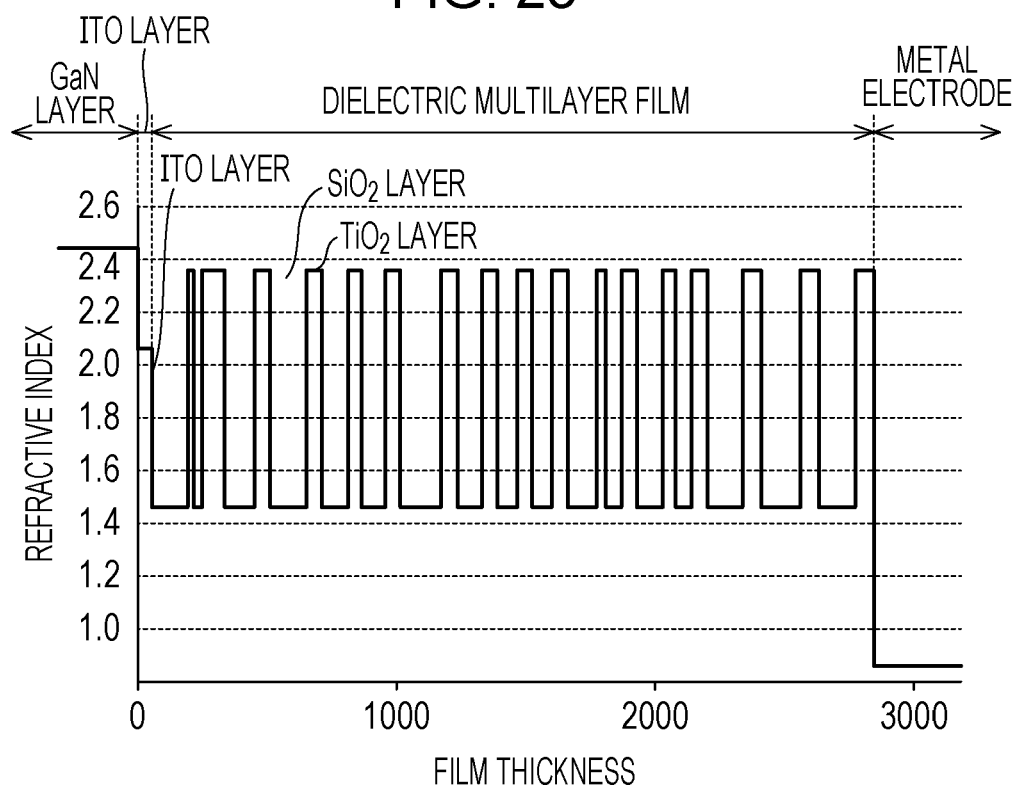
FIG. 23 is a schematic view illustrating the structure of a dielectric multilayer film constituting a reflection layer.

As illustrated in FIG. 19A, a nitride semiconductor layer 14i including an N-side layer 11i, a light emission layer 12, and a P-side layer 13 is grown on a growth substrate 9, and a transparent electrode layer 44 and a reflection layer 10i are then deposited. The deposition temperature of the reflection layer 10i may be in a temperature range in which the transparent electrode layer 44 does not degrade and may be 600° C. or lower. Thus, the reflection layer 10i can be deposited at a relatively high temperature, and a stable, good film can be obtained. The transparent electrode layer 44 is formed of, for example, ITO (indium-tin-oxide) and has a thickness of about 50 nm to 600 nm. The reflection layer 10i was formed by stacking 17 pairs of a $TiO_2$ thin film and a $SiO_2$ thin film as illustrated in FIG. 23. The thickness of the $TiO_2$ thin film is in the range of from 8 nm to 75 nm, and the film thickness of the $SiO_2$ thin film is in the range of from 8 nm to 171 nm. The film thickness was optimized for each layer. The film thickness was optimized so that the reflectance was 80% or more on average at an angle of incidence of 25 degrees or less in the wavelength range of from 440 nm to 650 nm. The thin films are stacked at a substrate temperature of 300° C. by an ion-beam vapor deposition method. The total thickness was 2.85 μm.

Figure 19B:
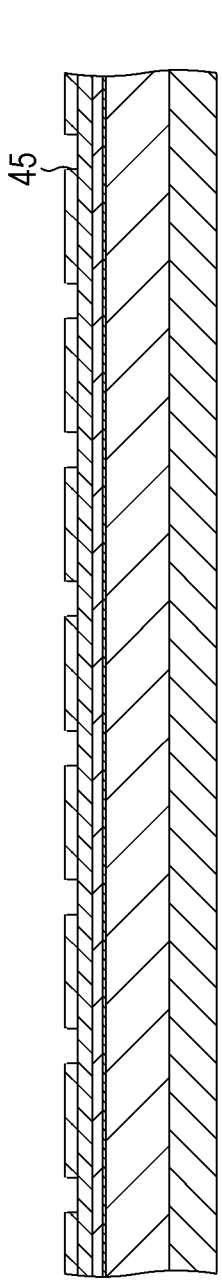
Figure 19C:
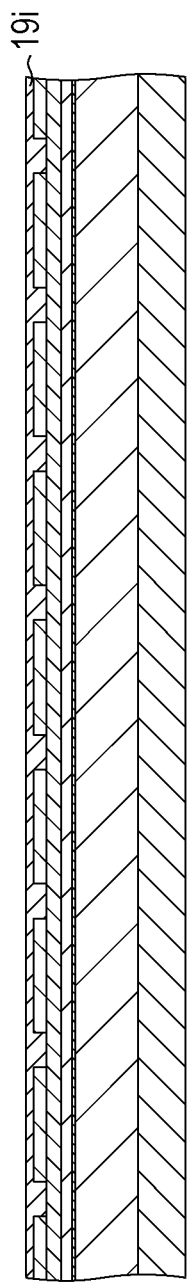
Figure 19D:
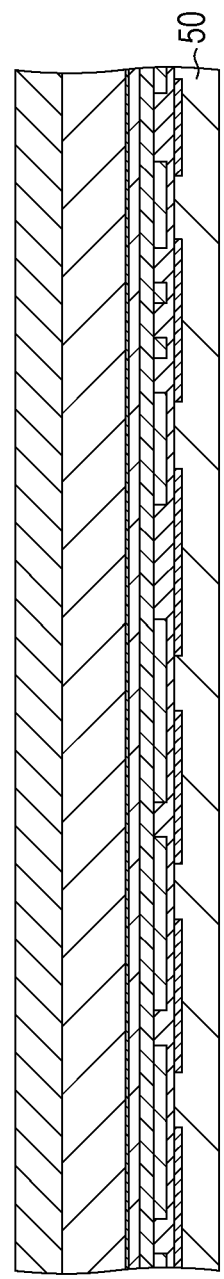
Figure 19E:
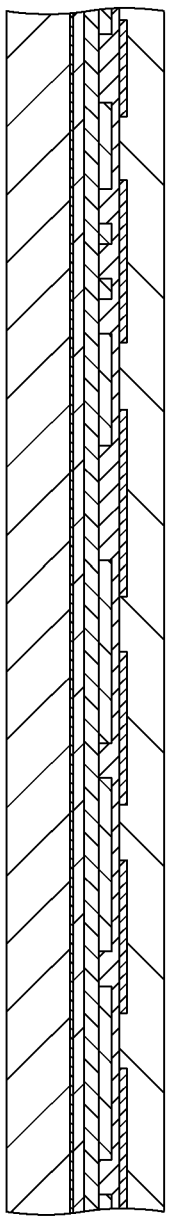

As illustrated in FIG. 19B, after the stacking of the reflection layer 10i, openings 45 are formed by a photolithography technique and a dry etching technique. The transparent electrode layer 44 appears at the bottom of the openings 45. Subsequently, as illustrated in FIG. 19C, a P-electrode layer 19i is formed. The P-electrode layer 19i preferably has plug portions that fill the openings 45. A flat film portion that covers planar portions is preferably present but may be omitted. The subsequent steps of bonding the growth substrate 9 to a drive circuit substrate 50 as illustrated in FIG. 19D and separating the growth substrate 9 as illustrated in FIG. 19E are the same as those in the first embodiment.

Figure 20A:
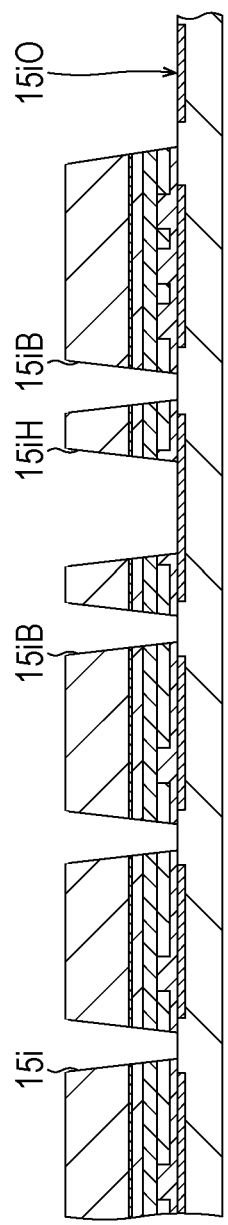
FIGS. 20A and 20B illustrate a process for producing a display device according to the eighth embodiment of the present disclosure (Part 2)
Figure 20B:
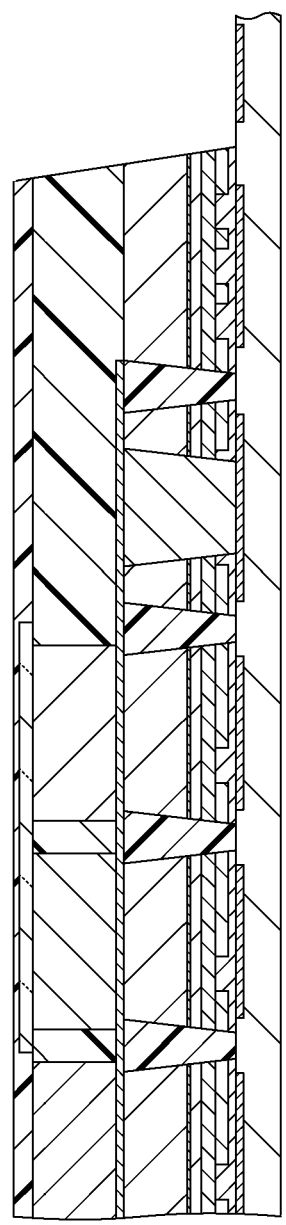

In the formation of a pixel isolation trench 15i illustrated in FIG. 20A, the nitride semiconductor layer 14i, the transparent electrode layer 44, the reflection layer 10i, and the P-electrode layer 19i are sequentially etched. Other configurations are the same as those in the first embodiment. The subsequent steps are the same as those in the first embodiment. Thus, the image display device 200i in FIG. 18 is formed.

Ninth Embodiment

The present embodiment significantly differs from the first embodiment in that the emission wavelength of micro LED elements 100j corresponds to bluish-purple light (peak wavelength: 410 nm±15 nm), which is near-ultraviolet light, and the transparent portion 21 is replaced with a blue wavelength conversion portion 21j. Accordingly, the layer configuration of a reflection layer 10j is changed so as to reflect blue light (peak wavelength: 460±15 nm) in addition to red and green. In addition, a transmission layer 25j covers the entire pixel region 1 including a blue sub-pixel 6, transmits the entire visible region from blue to red, and reflects only bluish-purple light. Other configurations are the same as those in the first embodiment.

Figure 21:
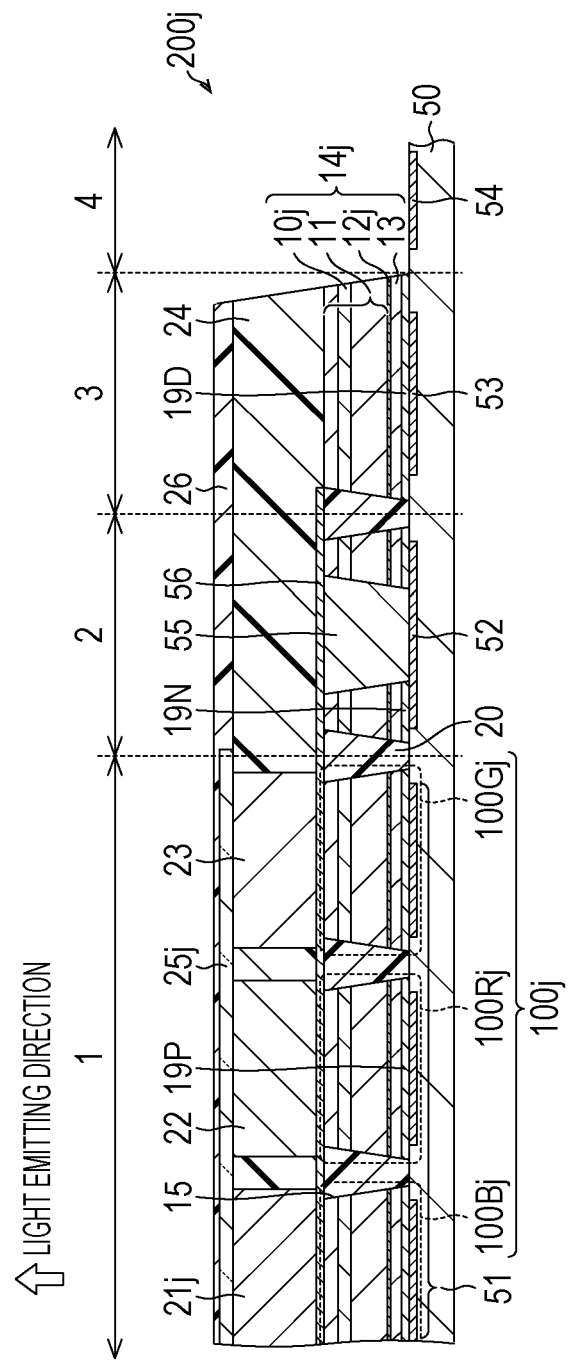
FIG. 21 is a sectional view of a display device according to a ninth embodiment of the present disclosure.

As illustrated in FIG. 21, the configuration of an image display device 200j of this configuration is not significantly different from that of the first embodiment. The quantum well layers of a light emission layer 12j are changed so that the micro LED elements 100j emit bluish-purple light. Mainly, the indium (In) concentration of the quantum well layers can be reduced. The layer configuration of the reflection layer 10j is changed so as to reflect blue light in addition to red and green. These are changes concerning a nitride semiconductor layer 14j.

On the blue sub-pixel 6, the transparent portion 21 is disposed in the first embodiment, whereas the blue wavelength conversion portion 21j is disposed in this configuration. The blue wavelength conversion portion 21j can be formed by dispersing wavelength conversion particles such as a phosphor, quantum dots, or quantum rods in a resin as in the red wavelength conversion portion and the green wavelength conversion portion. The transmission layer 25j is disposed not only on a red sub-pixel 7 and a green sub-pixel 8 but also on a blue sub-pixel 6. The film configuration of the transmission layer 25j is also changed so as to transmit blue light in addition to red and green and to reflect bluish-purple light.

As described above, according to this configuration, the emission wavelength of excitation light of the micro LED elements is not limited to blue but may be a wavelength of near-ultraviolet light or ultraviolet light or another wavelength. When near-ultraviolet light or ultraviolet light is used as excitation light, the thicknesses of the blue wavelength conversion portion 21j, the green wavelength conversion portion 23, and the red wavelength conversion portion 22 can be reduced and the light emission efficiency can be improved by providing the reflection layer 10j under the blue wavelength conversion portion 21j, the green wavelength conversion portion 23, and the red wavelength conversion portion 22 (on the excitation light source side). Miniaturization is facilitated, and the amounts of expensive wavelength conversion materials used are reduced. Thus, an effect of reducing the production cost is also achieved.

The present disclosure is not limited to each embodiment described above, and various modifications can be made thereto within the scope of the claims. Embodiments based on appropriate combinations of technical methods disclosed in different embodiments are also encompassed in the technical scope of the present disclosure. Furthermore, new technical features can be formed by combining technical methods disclosed in the respective embodiments.

The present disclosure contains subject matter related to that disclosed in Japanese Priority Patent Application JP 2018-038038 filed in the Japan Patent Office on Mar. 2, 2018, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An image display device comprising:
a drive circuit substrate;
micro LED elements;
a red wavelength conversion layer and a green wavelength conversion layer that each convert excitation light emitted from a corresponding one of the micro LED elements and emit converted red light and converted green light, respectively, to a side opposite to the drive circuit substrate, each of the micro LED elements and a corresponding either of the red wavelength conversion layer or the green wavelength conversion layer being stacked in this order on the drive circuit substrate,
wherein each of the micro LED elements includes a first multilayer film that reflects the red light and the green light converted by the red wavelength conversion layer and the green wavelength conversion layer, respectively, where the first multilayer film is only placed on a side of the micro LED element faced to the drive circuit substrate; and
a second multilayer film that transmits both the red light and the green light and reflects the excitation light, the second multilayer film being disposed on an emission side of the red wavelength conversion layer and an emission side of the green wavelength conversion layer.

2. The image display device according to claim 1, wherein the first multilayer film of the micro LED element is separated from each other.

3. The image display device according to claim 1, wherein the first multilayer film is included inside a nitride semiconductor layer that forms the micro LED elements.

4. The image display device according to claim 1, wherein the first multilayer film is disposed on the wavelength conversion layer side with respect to a light emission layer of the micro LED elements and transmits the excitation light.

5. The image display device according to claim 1, wherein the first multilayer film reflects the excitation light.

6. The image display device according to claim 1, wherein the first multilayer film includes a nitride semiconductor.

7. The image display device according to claim 6, wherein the first multilayer film has conductivity.

8. The image display device according to claim 7, wherein the first multilayer film has N-type conductivity.

9. The image display device according to claim 7, wherein the first multilayer film has P-type conductivity.

10. The image display device according to claim 6, wherein the first multilayer film has high resistivity.

11. The image display device according to claim 1, wherein the first multilayer film is a dielectric multilayer film.

12. The image display device according to claim 11, wherein the first multilayer film has a through portion in part thereof, and the through portion is provided for each of the micro LED elements.

13. The image display device according to claim 12, wherein the through portion is filled with a nitride semiconductor.

14. The image display device according to claim 12, wherein the through portion is filled with an electrode material.

15. The image display device according to claim 1, comprising:
a filter layer that transmits the long-wavelength light and that absorbs the excitation light, the filter layer being disposed on an emission side of the wavelength conversion layer.

16. The image display device according to claim 1, comprising:
a color filter layer that absorbs the excitation light and that transmits part of the long-wavelength light, the color filter layer being disposed on an emission side of the wavelength conversion layer.

17. The image display device according to claim 15, wherein the first multilayer film has peak reflectances at a wavelength of 460±15 nm, a wavelength of 520±15 nm, and a wavelength of 630±15 nm, and
the second multilayer film has a peak reflectance at a wavelength of 460±15 nm.

18. The image display device according to claim 1, wherein the red wavelength conversion layer and the green wavelength conversion layer include both wavelength conversion particles and scattering particles that do not perform wavelength conversion.

19. The image display device according to claim 1, wherein the micro LED elements includes a layered structure that includes a transparent insulating film and a metal film having a high reflectance on all sidewalls of the micro LED element, where the sidewalls are surfaces of the micro LED element other than the emission side surface and the drive circuit substrate side surface.

20. The image display device according to claim 1, wherein the second multilayer film is covered with a passivation film.

21. The image display device according to claim 1, wherein a transparent resin layer is provided between the second multilayer film and the red and green wavelength conversion layers and the red and green wavelength conversion layers, the transparent resin layer, and the second multilayer film are stacked in this order.

22. The image display device according to claim 1, wherein the red wavelength conversion layer and the green wavelength conversion layer cover a whole of light emission surfaces of the micro LED elements.

23. An image display device comprising:
a drive circuit substrate;
micro LED elements; and
a wavelength conversion layer that converts excitation light emitted from the micro LED elements and that emits converted long-wavelength light to a side opposite to the drive circuit substrate, the micro LED elements and the wavelength conversion layer being sequentially stacked on the drive circuit substrate,
wherein each of the micro LED elements includes a first multilayer film that reflects the long-wavelength light converted by the wavelength conversion layer, where the first multilayer film is only placed on a side of the micro LED element faced to the drive circuit substrate, and
the wavelength conversion layers covers a whole light emission surfaces of the micro LED elements.

24. The image display device according to claim 23, wherein a side edge of the first multilayer film is aligned with a side edge of a nitride semiconductor layer of the micro LED elements.

25. The image display device according to claim 23, wherein the micro LED elements include a layered structure that includes a transparent insulating film and a metal film having a high reflectance on all sidewalls of the micro LED element, where the sidewalls are surfaces of the micro LED element other than the emission side surface and the drive circuit substrate side surface.

26. The image display device according to claim 23, comprising:
a second multilayer film that transmits the long-wavelength light and that reflects the excitation light, the second multilayer film being disposed on an emission side of the wavelength conversion layer.

27. The image display device according to claim 26, wherein the second multilayer film is covered with a passivation film.

28. The image display device according to claim 26, wherein a transparent resin layer is provided between the second multilayer film and the wavelength conversion layers and the red and green wavelength conversion layers, the transparent resin layer, and the second multilayer film are stacked in this order.

29. The image display device according to claim 23, wherein the wavelength conversion layers includes both wavelength conversion particles and scattering particles.

30. An image display device comprising:
a drive circuit substrate;
micro LED elements; and
a wavelength conversion layer that converts excitation light emitted from the micro LED elements and that emits converted long-wavelength light to a side opposite to the drive circuit substrate, the micro LED elements and the wavelength conversion layer being sequentially stacked on the drive circuit substrate,
wherein each of the micro LED elements includes a first multilayer film that reflects the long-wavelength light converted by the wavelength conversion layer,
the first multilayer film is only placed on a side of the micro LED element faced to the drive circuit substrate, and
a side edge of the first multilayer film is aligned with a side edge of a nitride semiconductor layer of the micro LED elements.

31. The image display device according to claim 30, wherein the micro LED elements include a layered structure that includes a transparent insulating film and a metal film having a high reflectance on all sidewalls of the micro LED element, where the sidewalls are surfaces of the micro LED element other than the emission side surface and the drive circuit substrate side surface.

32. The image display device according to claim 30, wherein the wavelength conversion layers includes both wavelength conversion particles and scattering particles that do not perform wavelength conversion.

33. The image display device according to claim 1, wherein each of the micro LED elements includes a transparent electrode layer between a nitride semiconductor layer of the micro LED element and the first multilayer film.

34. The image display device according to claim 23, wherein each of the micro LED elements includes a transparent electrode layer between a nitride semiconductor layer of the micro LED element and the first multilayer film.

35. The image display device according to claim 30, wherein each of the micro LED elements includes a transparent electrode layer between a nitride semiconductor layer of the micro LED element and the first multilayer film.

\* \* \* \* \*